(12) United States Patent
Nakatsuji et al.

(10) Patent No.: US 10,355,017 B1
(45) Date of Patent: Jul. 16, 2019

(54) CMOS DEVICES CONTAINING ASYMMETRIC CONTACT VIA STRUCTURES AND METHOD OF MAKING THE SAME

(71) Applicant: SANDISK TECHNOLOGIES LLC, Addison, TX (US)

(72) Inventors: Hiroshi Nakatsuji, Yokkaichi (JP); Kiyokazu Shishido, Yokkaichi (JP); Hiroyuki Ogawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/007,370

(22) Filed: Jun. 13, 2018

Related U.S. Application Data

(60) Provisional application No. 62/647,137, filed on Mar. 23, 2018.

(51) Int. Cl.
*H01L 27/115* (2017.01)
*H01L 27/092* (2006.01)
(Continued)

(52) U.S. Cl.
CPC .... *H01L 27/11582* (2013.01); *H01L 21/0217* (2013.01); *H01L 21/0228* (2013.01); *H01L 21/02164* (2013.01); *H01L 21/02274* (2013.01); *H01L 21/302* (2013.01); *H01L 21/3212* (2013.01); *H01L 21/76283* (2013.01);
(Continued)

(58) Field of Classification Search
CPC ............. H01L 27/0922; H01L 21/8234; H01L 21/8232; H01L 21/8238; H01L 27/092; H01L 27/1157; H01L 27/105; H01L 23/52395; H01L 23/5226;
(Continued)

(56) References Cited

U.S. PATENT DOCUMENTS 5,915,167 A 6/1999 Leedy
6,319,782 B1 11/2001 Nakabayashi
(Continued)

FOREIGN PATENT DOCUMENTS

WO WO2002/015277 A2 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Thanhha S Pham
(74) *Attorney, Agent, or Firm* — The Marbury Law Group PLLC

(57) ABSTRACT

A CMOS device includes a p-type field effect transistor containing p-doped active regions, an n-type field effect transistor containing n-doped active regions, a silicon oxide layer overlying the n-type field effect transistor and not overlying the p-type field effect transistor, boron-doped epitaxial pillar structures contacting a top surface of, and epitaxially aligned to, a respective one of the p-doped active regions, first active region contact via structures contacting a top surface of a respective one of the boron-doped epitaxial pillar structures, and second active region contact via structures contacting a top surface of a respective one of the n-doped active regions.

10 Claims, 13 Drawing Sheets

(51) Int. Cl.

| | | |
|---|---|---|
| *H01L 21/82* | (2006.01) | |
| *H01L 23/522* | (2006.01) | |
| *H01L 27/11582* | (2017.01) | |
| *H01L 21/8238* | (2006.01) | |
| *H01L 21/02* | (2006.01) | |
| *H01L 21/762* | (2006.01) | |
| *H01L 21/302* | (2006.01) | |
| *H01L 23/528* | (2006.01) | |
| *H01L 27/1157* | (2017.01) | |
| *H01L 21/321* | (2006.01) | |

(52) U.S. Cl.
CPC .... *H01L 21/823878* (2013.01); *H01L 23/528* (2013.01); *H01L 23/5226* (2013.01); *H01L 27/092* (2013.01); *H01L 27/0922* (2013.01); *H01L 27/0928* (2013.01); *H01L 27/1157* (2013.01)

(58) Field of Classification Search
CPC ..... H01L 21/823871; H01L 21/823814; H01L 27/0925; H01L 27/0927
See application file for complete search history.

(56) References Cited

U.S. PATENT DOCUMENTS

| | | | |
|---|---|---|---|
| 6,323,525 | B1 | 11/2001 | Noguchi et al. |
| 7,005,350 | B2 | 2/2006 | Walker et al. |
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,394,716 | B2 | 3/2013 | Hwang et al. |
| 9,023,719 | B2 | 5/2015 | Pachamuthu et al. |
| 9,305,934 | B1 | 4/2016 | Ding et al. |
| 9,449,983 | B2 | 9/2016 | Yada et al. |
| 9,460,931 | B2 | 10/2016 | Pachamuthu et al. |
| 9,601,503 | B2 | 3/2017 | Fukuzumi et al. |
| 9,859,422 | B2 | 1/2018 | Nishikawa et al. |
| 2006/0157797 | A1 | 7/2006 | Tateshita |
| 2007/0155074 | A1 | 7/2007 | Ho et al. |
| 2007/0210338 | A1 | 9/2007 | Orlowski |
| 2007/0252201 | A1 | 11/2007 | Kito et al. |
| 2008/0064173 | A1* | 3/2008 | Hung ................ H01L 21/82380 438/299 |
| 2008/0096328 | A1 | 4/2008 | Chol et al. |
| 2008/0116583 | A1 | 5/2008 | Yuki |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0090286 | A1 | 4/2010 | Lee et al. |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0233688 | A1 | 9/2011 | Ren et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0119287 | A1 | 5/2012 | Park et al. |
| 2012/0168877 | A1 | 7/2012 | Mukherjee et al. |
| 2012/0261756 | A1 | 10/2012 | Kanike et al. |
| 2012/0280290 | A1 | 11/2012 | Khakifirooz et al. |
| 2013/0140669 | A1 | 6/2013 | Yugami et al. |
| 2013/0161746 | A1 | 6/2013 | Posseme et al. |
| 2013/0181264 | A1 | 7/2013 | Liao et al. |
| 2013/0217190 | A1 | 8/2013 | Jagannathan et al. |
| 2013/0264631 | A1 | 10/2013 | Alsmeier et al. |
| 2013/0320417 | A1 | 12/2013 | Mukherjee |
| 2014/0117421 | A1 | 5/2014 | Seo et al. |
| 2014/0154846 | A1 | 6/2014 | Cheng et al. |
| 2015/0008520 | A1 | 1/2015 | Cheng et al. |
| 2015/0206945 | A1 | 7/2015 | Chen et al. |
| 2015/0214058 | A1 | 7/2015 | Basker et al. |
| 2015/0364490 | A1 | 12/2015 | Oda |
| 2016/0163702 | A1 | 6/2016 | Wu et al. |
| 2016/0260712 | A1 | 9/2016 | Yagishita |
| 2016/0351709 | A1 | 12/2016 | Nishikawa et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

International Search Report, PCT/US2013/035567, dated Sep. 30, 2013, 6pgs.

Ishitani, A. et al., "Local Loading Effect in Selective Silicon Epitaxy," Japanese Journal of Applied Physics, vol. 23, No. 6, pp. L391-L393, (Jun. 1984).

International Search Report and Written Opinion of the International Searching Authority for PCT/US2016/028473, dated Jul. 8, 2016, 16 pages.

U.S. Appl. No. 15/593,916, filed May 12, 2017, SanDisk Technologies Inc.

U.S. Appl. No. 15/617,499, filed Jun. 8, 2017, SanDisk Technologies Inc.

U.S. Appl. No. 15/916,720, filed Mar. 9, 2018, SanDisk Technologies Inc.

U.S. Appl. No. 15/933,947, filed Mar. 23, 2018, SanDisk Technologies Inc.

* cited by examiner

US 10,355,017 B1

CMOS DEVICES CONTAINING ASYMMETRIC CONTACT VIA STRUCTURES AND METHOD OF MAKING THE SAME

RELATED APPLICATIONS

The instant application claims the benefit of priority from U.S. Provisional Application Ser. No. 62/647,137 filed on Mar. 23, 2018, the entire contents of which are incorporated herein by reference.

FIELD

The present disclosure relates generally to the field of semiconductor devices, and particularly to asymmetric contact via structures for CMOS devices and methods of manufacturing the same.

BACKGROUND

Recently, ultra-high-density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layers or replaced with electrically conductive layers. Memory openings are formed through the alternating stack, and are filled with memory stack structures, each of which includes a vertical stack of memory elements and a vertical semiconductor channel.

SUMMARY

According to an aspect of the present disclosure, a CMOS device includes a p-type field effect transistor containing p-doped active regions, an n-type field effect transistor containing n-doped active regions, a silicon oxide layer overlying the n-type field effect transistor and not overlying the p-type field effect transistor, boron-doped epitaxial pillar structures contacting a top surface of, and epitaxially aligned to, a respective one of the p-doped active regions, first active region contact via structures contacting a top surface of a respective one of the boron-doped epitaxial pillar structures, and second active region contact via structures contacting a top surface of a respective one of the n-doped active regions.

According to another aspect of the present disclosure, a method of forming a semiconductor structure is provided, which comprises: forming a combination of a p-type field effect transistor including p-doped active regions, an n-type field effect transistor including n-doped active regions, and a first silicon oxide liner and a first silicon nitride liner that overlie the p-type field effect transistor and the n-type field effect transistor on a semiconductor substrate; forming a second silicon oxide liner covering the n-type field effect transistor and not covering the p-type field effect transistor; forming a second silicon nitride liner overlying the second silicon oxide liner; forming a planarization silicon oxide layer over the second silicon nitride liner; simultaneously forming p-type active region via cavities over the p-doped active regions and n-type active region via cavities over the n-doped active region employing a first anisotropic etch process, wherein the p-type active region via cavities extends to a respective top surface of the p-doped active regions, and the n-type active region via cavities have a respective bottom surface within one of the second silicon oxide liner, the first silicon nitride liner, and the first silicon oxide liner; forming boron-doped epitaxial pillar structures epitaxially aligned to the p-doped active regions on top surfaces of the p-type active regions employing a selective epitaxy process; extending the n-type active region via cavities to top surfaces of the n-doped active regions; and forming contact via structures at least in the p-type active region via cavities and the n-type active region via cavities.

DETAILED DESCRIPTION

Figure 1:
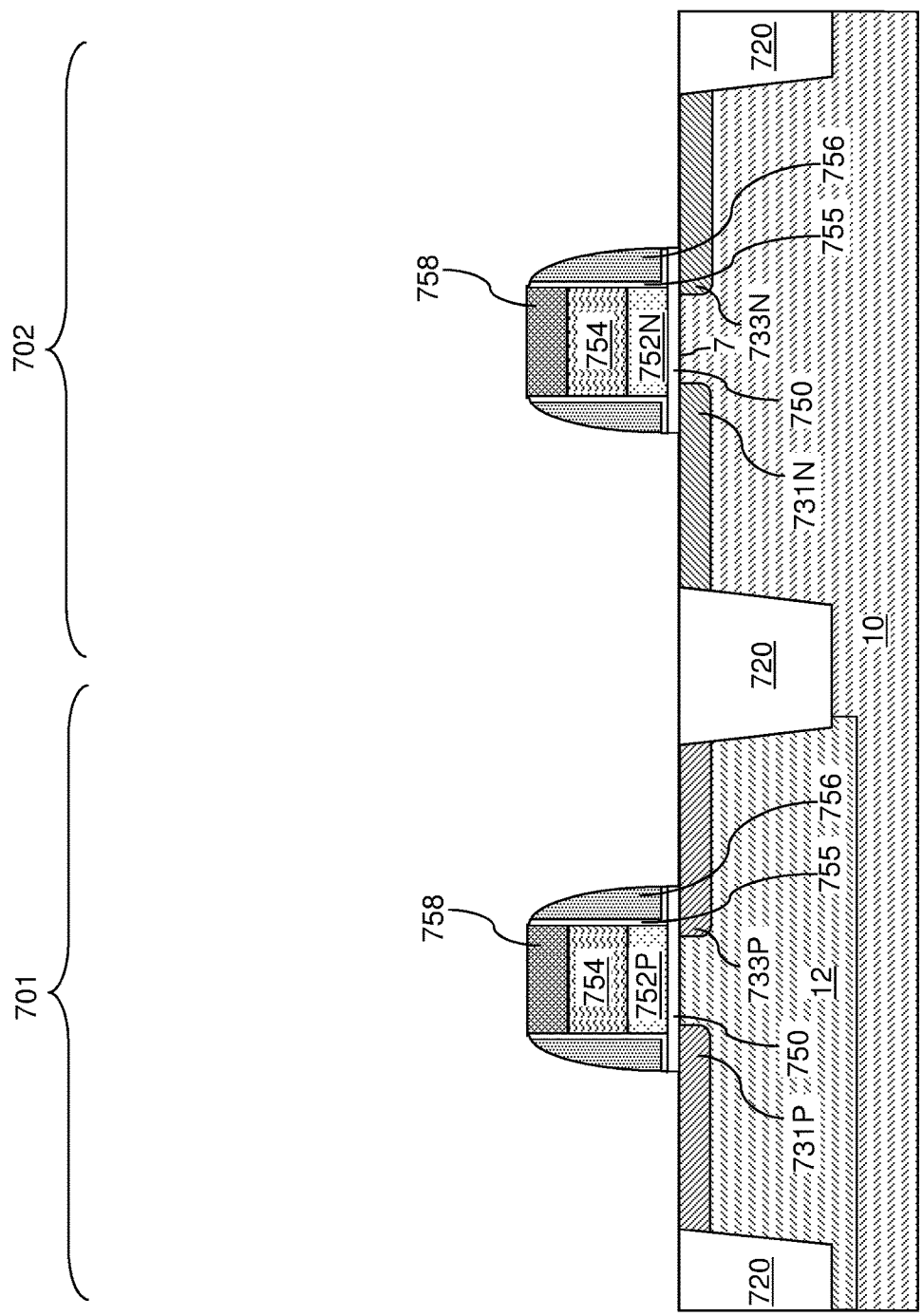
FIG. 1 is a schematic vertical cross-sectional view of an exemplary structure after formation of gate stacks and extension regions of a p-type field effect transistor and an n-type field effect transistor according to an embodiment of the present disclosure.

CMOS under Array (CUA) architecture is employed for high-density three-dimensional memory devices, such as NAND memory devices, to provide peripheral circuitry on a semiconductor substrate and under a three-dimensional array of memory elements. The manufacturing process for the three-dimensional array of memory elements employs high temperature processes, which adds thermal budget to the CMOS devices on the semiconductor substrate. Particularly, substrate contact via structures that provide electrical contact to active regions (such as source regions and drain regions) of field effect transistors are subjected to significant thermal budget during formation of the three-dimensional array of memory elements. High thermal budget to the substrate contact via structures causes boron absorption by a barrier metal (such as titanium) of the substrate contact via structures. This effect is not significant for larger diameter n-type dopants, such as arsenic or phosphorus. Thus, the high thermal budget causes formation of a Schottky barrier junction at the bottom of the substrate contact via structures and an increase in the contact resistance only for p-doped active regions, while n-doped active regions are not subjected to such dopant loss.

A significant portion of active regions are formed at minimum lithographically printable dimension (which is commonly referred to as "critical dimensions"). Thus, patterning of the active regions or contact structures to the active regions typically include the use of a costly high-performance lithography tool such an immersion lithography tool. Addition of a high-performance lithographic patterning process to modify only contact structures to p-type active regions without modifications to contact structures to n-type active regions can significantly increase the processing cost for the peripheral devices in the CUA architecture.

According to an aspect of the present disclosure, a combination of an etch stop liner and an inexpensive block level mask can be employed to alter substrate contact via structures to p-doped active regions without modifications to contact via structures to the substrate contact via structures to n-doped active regions. Thus, an embodiment provides a method for modifying substrate contact via structures to p-doped active regions to counter the effect of boron absorption without modifications to contact via structures to the substrate contact via structures to n-doped active regions and without use of an expensive lithography process.

As discussed above, an embodiment of the present disclosure is directed to asymmetric contact via structures for CMOS devices and methods of manufacturing the same, the various aspects of which are now discussed in detail. The embodiments of the disclosure can be employed to form various semiconductor structures such as multilevel memory structures, non-limiting examples of which include three-dimensional monolithic memory array devices comprising a plurality of NAND memory strings and employing a CMOS under array (CUA) architecture in which CMOS field effect transistors are provided underneath a three-dimensional array of memory elements.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing complementary metal oxide semiconductor (CMOS) field effect transistors and overlying semiconductor devices such as three-dimensional memory devices on a substrate. The exemplary structure includes a substrate, which can be a semiconductor substrate (10, 12). As used herein, the semiconductor substrate (10, 12) may be a semiconductor wafer, and can include at least one elemental semiconductor material (e.g., single crystal silicon wafer or layer), at least one III-V compound semiconductor material, or at least one II-VI compound semiconductor material. The semiconductor substrate (10, 12) may have one or more doped wells 12 in its top surface and/or one or more semiconductor layers located over its top surface. The semiconductor substrate (10, 12) can include a substrate semiconductor layer 10 having a doping of a first conductivity type (such as p-type or n-type), and at least one doped well 12 having a doping of a second conductivity type that is the opposite of the first conductivity type. The substrate semiconductor layer 10 can be provided as a semiconductor material layer over a commercially available semiconductor substrate (e.g., silicon wafer) or can be a top portion of the bulk semiconductor substrate (e.g., silicon wafer). Alternatively, the substrate semiconductor layer 10 may comprise a semiconductor layer formed on a top surface of an insulating or conductive substrate, such as a silicon-on-insulator type substrate.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from $1.0$ S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The substrate semiconductor layer 10 can include a single crystalline semiconductor material such as single crystalline silicon. The atomic concentration of first conductivity type dopants in the substrate semiconductor layer 10 can be in a range from $1.0\times10^{14}/cm^{3}$ to $1.0\times10^{17}/cm^{3}$, although lesser and greater atomic concentrations can also be employed. The doped well 12 can be formed by implanting dopants of the second conductivity through the top surface 7 of the semiconductor substrate into a surface portion of the substrate semiconductor layer 10. The net dopant concentration (i.e., the atomic concentration of the second conductivity type dopants less the atomic concentration of the first conductivity type dopants) in the doped well 12 can be in a range from $1.0\times10^{14}/cm^{3}$ to $1.0\times10^{17}/cm^{3}$, although lesser and greater atomic concentrations can also be employed.

Generally, a p-doped semiconductor material region and an n-doped semiconductor material region are formed in the semiconductor substrate (10, 12). The device region including the n-doped semiconductor material region 12 within the semiconductor substrate (10, 12) is herein referred to as a first device region 701 in which a p-type field effect transistor (PMOS) is subsequently formed, and is also referred to as a p-type field effect transistor or PMOS region. The device region including the p-doped semiconductor material region 10 within the semiconductor substrate (10, 12) is herein referred to as a second device region 702 in which an n-type field effect transistor (NMOS) is subsequently formed, and is also referred to as an n-type field effect transistor or NMOS region. In the illustrated example, the substrate semiconductor layer 10 has a p-type doping and the doped well 12 is formed within the first device region 701 with an n-type doping. Alternatively, the substrate semiconductor layer 10 has an n-type doping and the doped well 12 is formed within the second device region 702 with a p-type doping. Thus, a p-doped semiconductor material region can be provided in the second device region 702, and an n-doped semiconductor material region can be formed in the first device region 701.

Shallow trench isolation structures 720 can be formed in upper portions of the semiconductor substrate (10, 12) to provide electrical isolation among neighboring devices. For example, shallow trenches can be formed around each device region that requires electrical isolation from neighboring device regions, and can be filled with a dielectric material such as silicon oxide. Excess portions of the dielectric material can be removed from above the top surface of the semiconductor substrate (10, 12) by a planarization process such as chemical mechanical planarization. Remaining portions of the dielectric material in the shallow trenches constitute the shallow trench isolation structures 720.

A gate dielectric layer, a semiconductor material layer, a metallic gate material layer, and a gate cap dielectric layer can be sequentially deposited on the top surface 7 of the semiconductor substrate (10, 12). The gate dielectric layer includes a gate dielectric material such as silicon oxide and/or a dielectric metal oxide. The semiconductor material layer can include a doped or undoped semiconductor material such as doped or undoped polysilicon or amorphous silicon. The metallic gate material layer includes a metal or metal alloy gate material such as tungsten, tungsten silicide, titanium silicide, etc. The gate cap dielectric layer includes a dielectric material such as silicon nitride.

The gate cap dielectric layer, the metallic gate material layer, and the semiconductor material layer can be patterned, for example, by application and patterning of a photoresist layer thereabove, and by transferring the pattern in the photoresist layer through the gate cap dielectric layer, the metallic gate material layer, and the semiconductor material layer employing an anisotropic etch process. The anisotropic etch process can stop on the top surface of the gate dielectric layer. Patterned portions of the gate cap dielectric layer constitute gate cap dielectrics 758, patterned portions of the metallic gate material layer constitute metallic gate electrode portions 754, and patterned portions of the semiconductor material layer constitute in-process semiconductor gate electrode portions 752. As used herein, an "in-process" structure refers to a structure formed during a manufacturing process and is subsequently modified before the end of the manufacturing process. Each stack of an in-process semiconductor gate electrode portion 752, a metallic gate electrode portion 754, and a gate cap dielectric 758 constitutes an in-process gate stack (752, 754, 758). The photoresist layer can be subsequently removed, for example, by ashing. In one embodiment, the semiconductor gate electrode portion 752 can be a p-type doped polysilicon gate electrode portion 752P in the first device region 701, while semiconductor gate electrode portion 752 can be a n-type doped polysilicon gate electrode portion 752N in the second device region 702.

In one embodiment, the PMOS and/or NMOS transistors have a low doped drain (LDD) configuration. In this embodiment, first block level photoresist layer can be applied and patterned to cover the second device region 702 while not covering the first device region 701. P-type dopants can be implanted into surface portions of the semiconductor substrate (10, 12) in the first device region 701 that are not masked by the first block level photoresist layer or the in-process gate stacks (752, 754, 758). Surface portions of the semiconductor substrate (10, 12) in the first device region 701 that are implanted with the p-type dopants form p-doped extension regions (731P, 733P). The p-doped extension regions (731P, 733P) include a first source extension region 731P and a first drain extension region 733P. Thus, the first source extension region 731P can be a p-doped source extension region, and the first drain extension region 733P can be a p-doped drain extension region. The first source extension region 731P and the first drain extension region 733P form p-n junctions with an underlying portion of the semiconductor substrate (10, 12), which can be, for example, the doped well 12 having an n-type doping. The first block level photoresist layer can be subsequently removed, for example, by ashing.

In this embodiment, a second block level photoresist layer can be applied and patterned to cover the first device region 701 while not covering the second device region 702. N-type dopants can be implanted into surface portions of the semiconductor substrate (10, 12) in the second device region 702 that are not masked by the second block level photoresist layer or the in-process gate stacks (752, 754, 758). Surface portions of the semiconductor substrate (10, 12) in the second device region 702 that are implanted with the n-type dopants form n-doped extension regions (731N, 733N). The n-doped extension regions (731N, 733N) include a second source extension region 731N and a second drain extension region 733N that have an n-type doping. Thus, the second source extension region 731N can be an n-doped source extension region, and the second drain extension region 733N can be an n-doped drain extension region. The second source extension region 731N and the second drain extension region 733N form p-n junctions with an underlying portion of the semiconductor substrate (10, 12), which can be, for example, the substrate semiconductor layer 10 having a p-type doping. The second block level photoresist layer can be subsequently removed, for example, by ashing. Alternatively, if the NMOS and/or PMOS transistors do not have the LDD configuration, then the above implantation steps for forming the extension regions can be omitted.

A conformal gate dielectric liner including a first dielectric material such as silicon oxide can be deposited by a conformal deposition process. The conformal gate dielectric liner can have a thickness in a range from 2 nm to 10 nm, although lesser and greater thicknesses can also be employed. A continuous gate spacer dielectric layer including a second dielectric material such as silicon nitride can be subsequently deposited over the conformal gate dielectric liner. The thickness of vertical portions of the continuous gate spacer dielectric layer can be in a range from 5 nm to 50 nm, although lesser and greater thicknesses can also be employed. An anisotropic etch process can be performed to remove horizontal portions of the continuous gate spacer dielectric layer and the conformal gate dielectric liner. Remaining portions of the continuous gate spacer dielectric layer constitute gate dielectric spacers 756, and remaining portions of the conformal gate dielectric liner constitute gate dielectric liners 755. Portions of the gate dielectric layer that are not covered by the in-process gate stacks (752, 754, 758), the gate dielectric liners 755, or the gate dielectric spacers 756 can be removed by a terminal portion of the anisotropic etch process. The anisotropic etch process can stop on the top surface of the semiconductor substrate (10, 12). Each remaining portion of the gate dielectric layer constitutes a gate dielectric 750.

Figure 2:
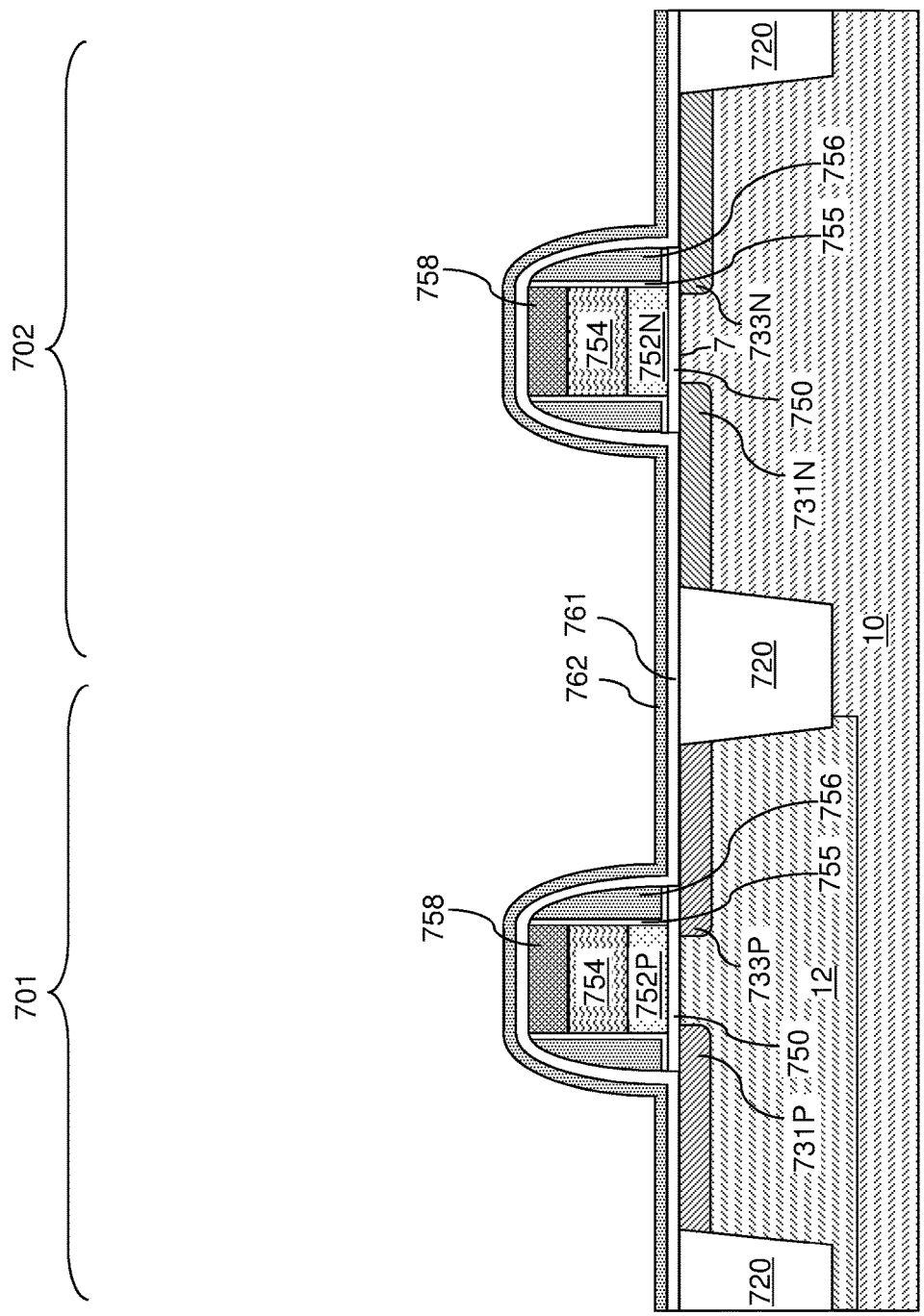
FIG. 2 is a schematic vertical cross-sectional view of the exemplary structure after formation of a first silicon oxide liner and a first silicon nitride liner according to an embodiment of the present disclosure.

Referring to FIG. 2, an optional first silicon oxide liner 761 and an optional first silicon nitride liner 762 can be sequentially deposited. The first silicon oxide liner 761 includes silicon oxide and can be formed by a conformal deposition process. For example, the first silicon oxide liner 761 can be formed by decomposition of a silicon oxide precursor such as tetraethylorthosilicate (TEOS) in a low pressure chemical vapor deposition (LPCVD) process. The thickness of the first silicon oxide liner 761 can be in a range from 1 nm to 10 nm, although lesser and greater thicknesses can also be employed. The first silicon oxide liner 761 promotes adhesion of the first silicon nitride liner 762.

The first silicon nitride liner 762 can be deposited by a conformal deposition process such as low pressure chemical vapor deposition. The first silicon nitride liner 762 can function as a diffusion barrier layer. The thickness of the first silicon nitride liner 762 can be in a range from 2 nm to 20 nm, although lesser and greater thicknesses can also be employed.

Figure 3:
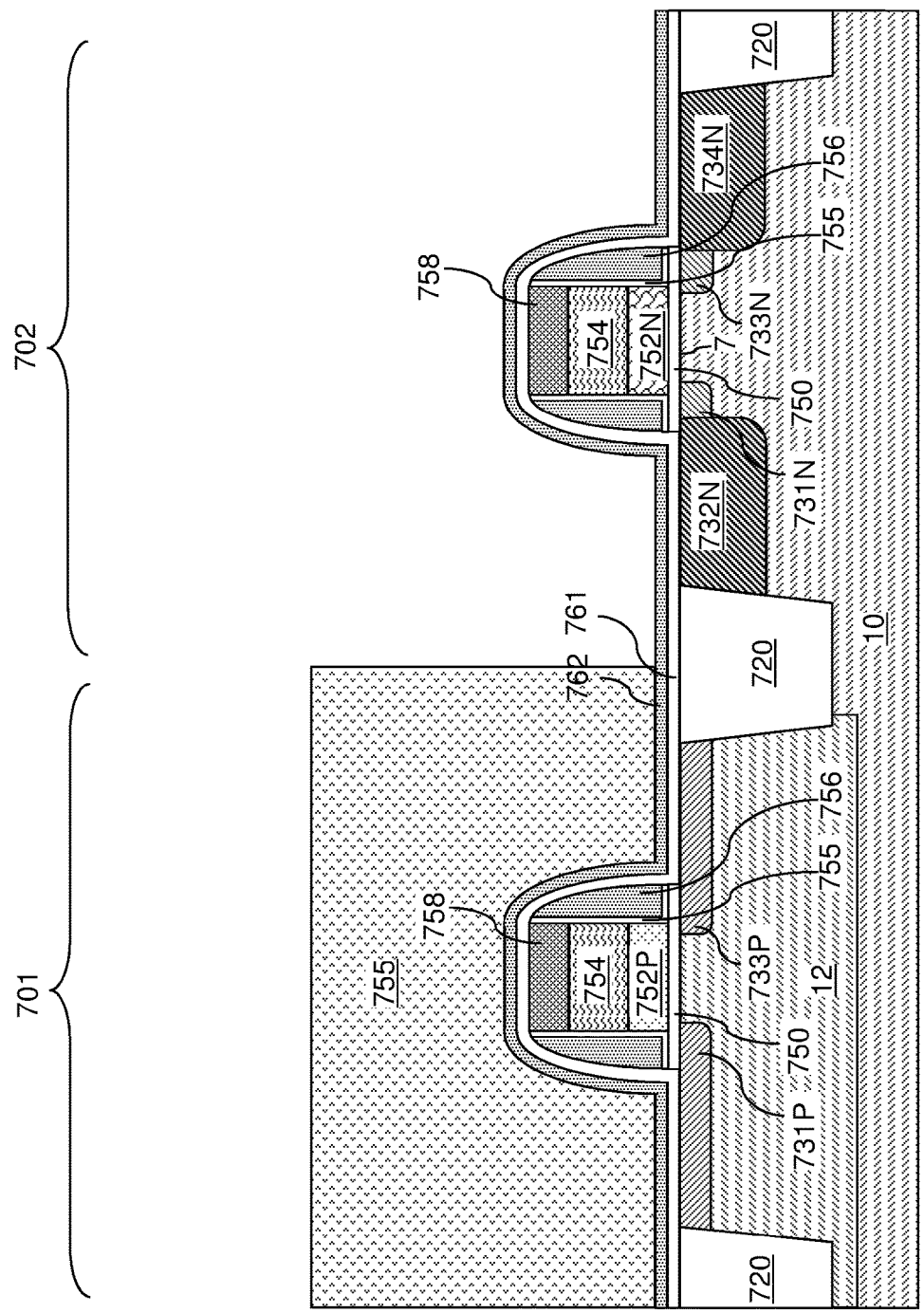
FIG. 3 is a schematic vertical cross-sectional view of the exemplary structure after formation of n-doped active regions according to an embodiment of the present disclosure.

Referring to FIG. 3, a first photoresist layer 755 can be applied over the exemplary structure, and can be patterned to cover the portion of the semiconductor substrate (10, 12) in the first device region 701 without covering the portion of the semiconductor substrate (10, 12) in the second device region 702. N-type dopants can be implanted into unmasked portions of the exemplary structure to form n-doped active regions (732N, 734N). The n-doped active regions (732N, 734N) can include a second source region 732N and a second drain region 734N. The dopant concentration of the n-type dopants in the second source region 732N, and the second drain region 734N can be in a range from $1.0\times10^{20}$/cm$^3$ to $1.0\times10^{21}$/cm$^3$, although lesser and greater dopant concentrations can also be employed. The first photoresist layer 755 can be subsequently removed, for example, by ashing.

Depending on the thickness of the metallic gate electrode portion 754 and the gate cap dielectric 758, the N-type dopants may or may not reach the underlying semiconductor gate electrode portion 752. For example, if the underlying semiconductor gate electrode portion 752 is already doped N-type and the metallic gate electrode portion 754 and the gate cap dielectric 758 are sufficiently thick to block the implanted dopants at the selected ion implantation energy, then N-type dopants do not reach the underlying semiconductor gate electrode portion 752. In contrast, if the underlying semiconductor gate electrode portion 752 is undoped and the metallic gate electrode portion 754 and the gate cap dielectric 758 are not sufficiently thick to block the implanted dopants at the selected ion implantation energy, then N-type dopants are implanted into the underlying semiconductor gate electrode portion 752 and can doped it N-type.

Figure 4:
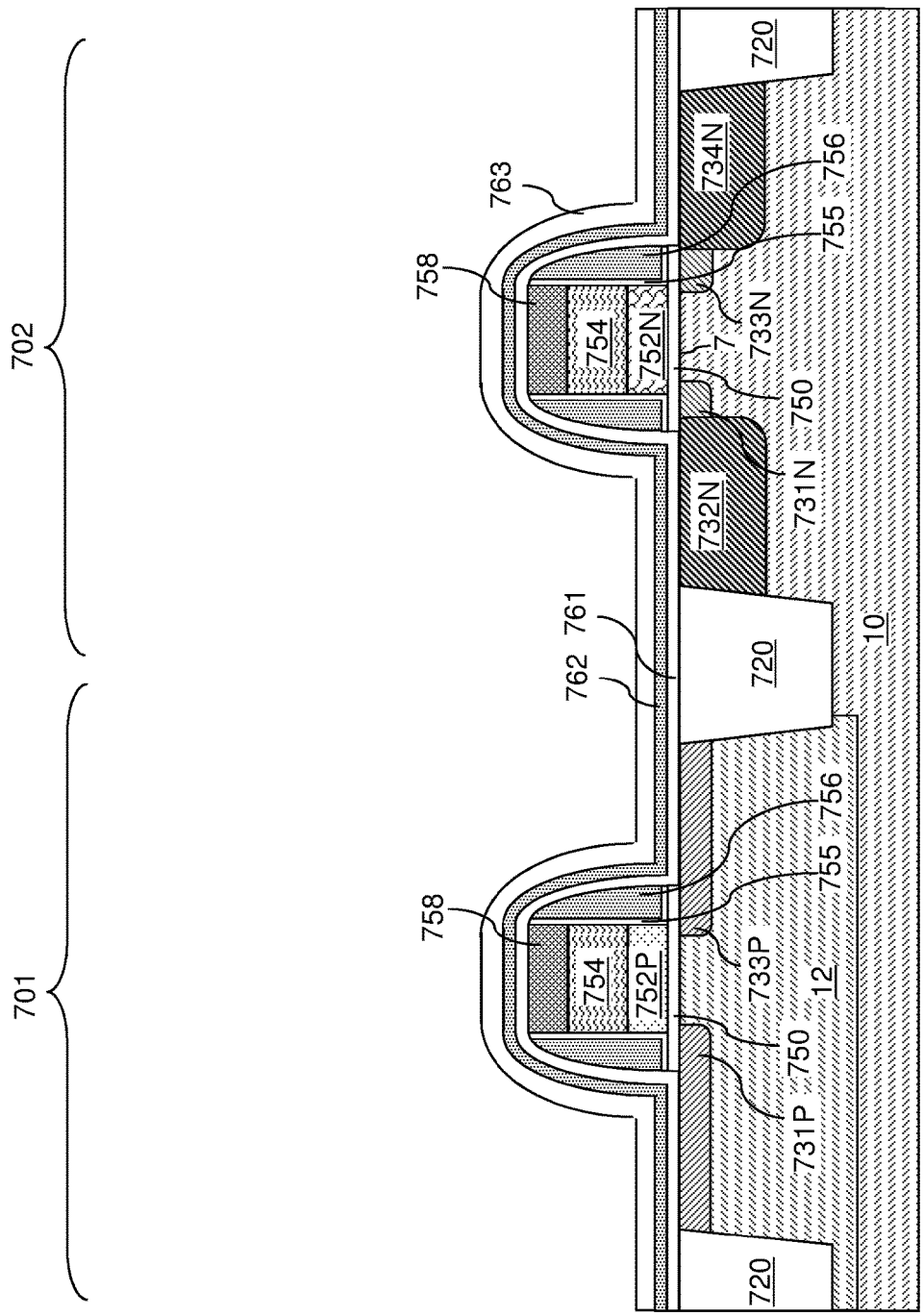
FIG. 4 is a schematic vertical cross-sectional view of the exemplary structure after formation of a second silicon oxide liner according to an embodiment of the present disclosure.

Referring to FIG. 4, a second silicon oxide liner 763 can be formed over the first silicon nitride liner 762 by a conformal or non-conformal deposition process. For example, the second silicon oxide liner 763 can be deposited by low pressure chemical vapor deposition or plasma enhanced chemical vapor deposition employing thermal decomposition or plasma decomposition of a silicon oxide precursor such as TEOS. The thickness of horizontal portions of the second silicon oxide liner 763 can be in a range from 10 nm to 100 nm, such as from 20 nm to 70 nm, although lesser and greater thicknesses can also be employed. In one embodiment, the thickness of horizontal portions of the second silicon oxide liner 763 can be at least twice, and/or at least three times, the greater of the thicknesses of the first silicon oxide liner 761 and the first silicon nitride liner 762.

Figure 5:
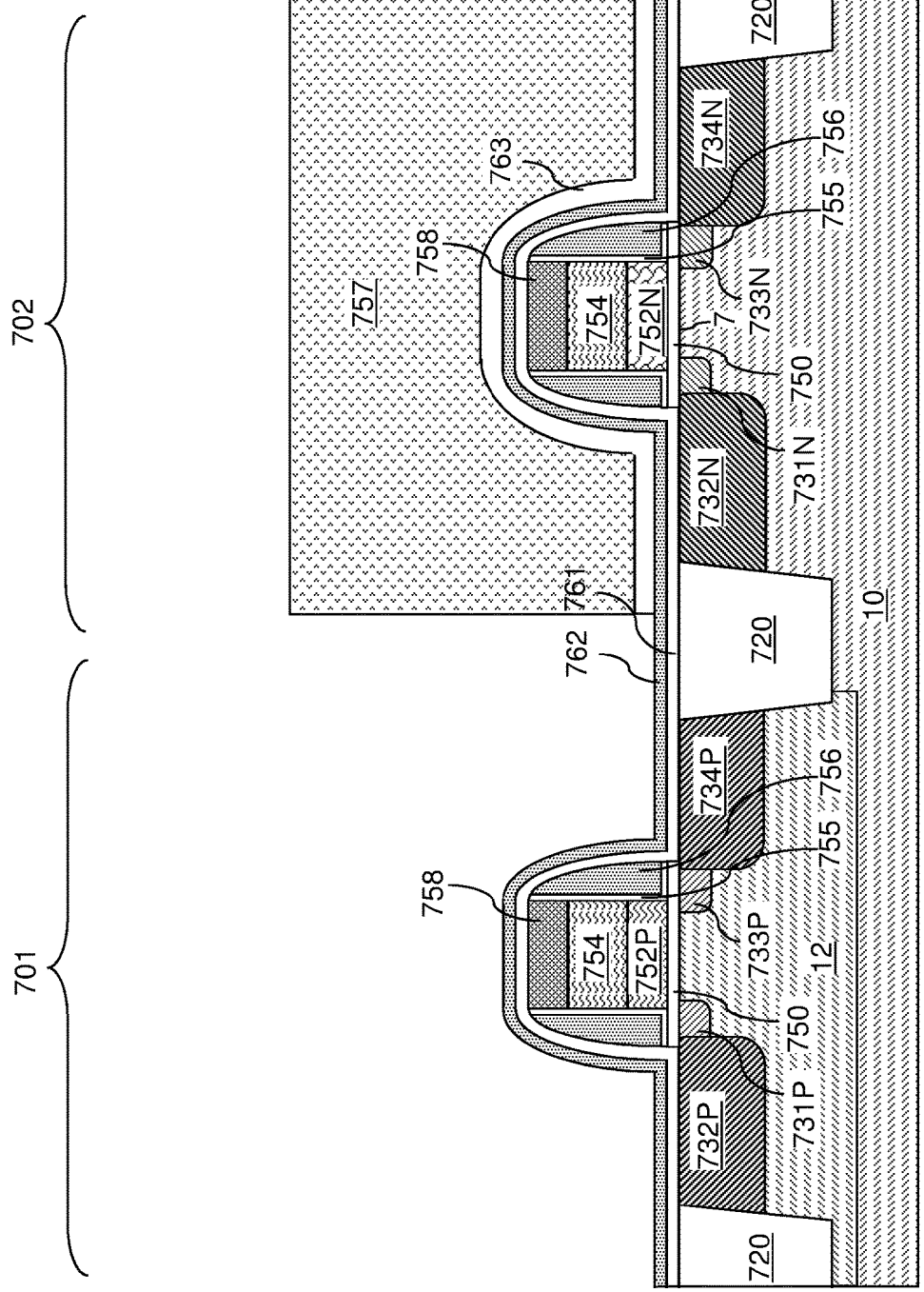
FIG. 5 is a schematic vertical cross-sectional view of the exemplary structure after patterning of the second silicon oxide liner and formation of p-doped active regions according to an embodiment of the present disclosure.

Referring to FIG. 5, a second photoresist layer 757 can be applied over the exemplary structure, and can be patterned to cover the portion of the semiconductor substrate (10, 12) and overlying layers in the second device region 702 without covering the portion of the semiconductor substrate (10, 12) and the overlying layers in the first device region 701. The unmasked portion of the second silicon oxide liner 763 can be removed from the first device region 701 by an etch process that removes the silicon oxide material of the second silicon oxide liner 763 selective to the material of the first silicon nitride liner 762. As used herein, an etch process removes a first material selective to a second material if the etch process removes the first material at an etch rate that is at least three times (such as at least ten times) the etch rate of the second material. For example, a wet etch process employing hydrofluoric acid can be employed to remove the physically exposed portions of the second silicon oxide liner 763 from the first device region 701, while the portion of the second silicon oxide liner 763 in the second device region 702 is protected by the second photoresist layer 757.

P-type dopants can be implanted into unmasked portions of the exemplary structure to form p-doped active regions (732P, 734P) in the implanted surface portions of the semiconductor substrate (10, 12) employing the second photoresist layer 757 as an implantation mask. The p-doped active regions (732P, 734P) can include a first source region 732P and a first drain region 734P. The dopant concentration of the p-type dopants in the first source region 732P, and the first drain region 734P can be in a range from $1.0 \times 10^{20}/cm^3$ to $1.0 \times 10^{21}/cm^3$, although lesser and greater dopant concentrations can also be employed. The second photoresist layer 757 can be subsequently removed, for example, by ashing.

Depending on the thickness of the metallic gate electrode portion 754 and the gate cap dielectric 758, the P-type dopants may or may not reach the underlying semiconductor gate electrode portion 752. For example, if the underlying semiconductor gate electrode portion 752 is already doped P-type and the metallic gate electrode portion 754 and the gate cap dielectric 758 are sufficiently thick to block the implanted dopants at the selected ion implantation energy, then P-type dopants do not reach the underlying semiconductor gate electrode portion 752. In contrast, if the underlying semiconductor gate electrode portion 752 is undoped and the metallic gate electrode portion 754 and the gate cap dielectric 758 are not sufficiently thick to block the implanted dopants at the selected ion implantation energy, then P-type dopants are implanted into the underlying semiconductor gate electrode portion 752 and can doped it P-type.

A p-type field effect transistor (PMOS) 101 is formed in the first device region 701, and thus, the first device region 701 is a p-type field effect transistor (PMOS) region. An n-type field effect transistor (NMOS) 102 is formed in the second device region 702, and thus, the second device region 702 is an n-type field effect transistor (NMOS) region. The second silicon oxide liner 763 covers the n-type field effect transistor and does not cover the p-type field effect transistor. Thus, the asymmetry in the dielectric layer stacks overlying the p-type field effect transistor 101 and the n-type field effect transistor 102 is introduced employing block level lithographic masks that pattern the photoresist layers that define the first block level photoresist layer, the second block level photoresist layer, the first photoresist layer 755, and the second photoresist layer 757, and use of deep ultraviolet (DUV) lithography mask is not necessary (but is not necessarily excluded) at the processing steps that follow the definition of the pattern for the in-process gate stacks (752, 754, 758).

Figure 6:
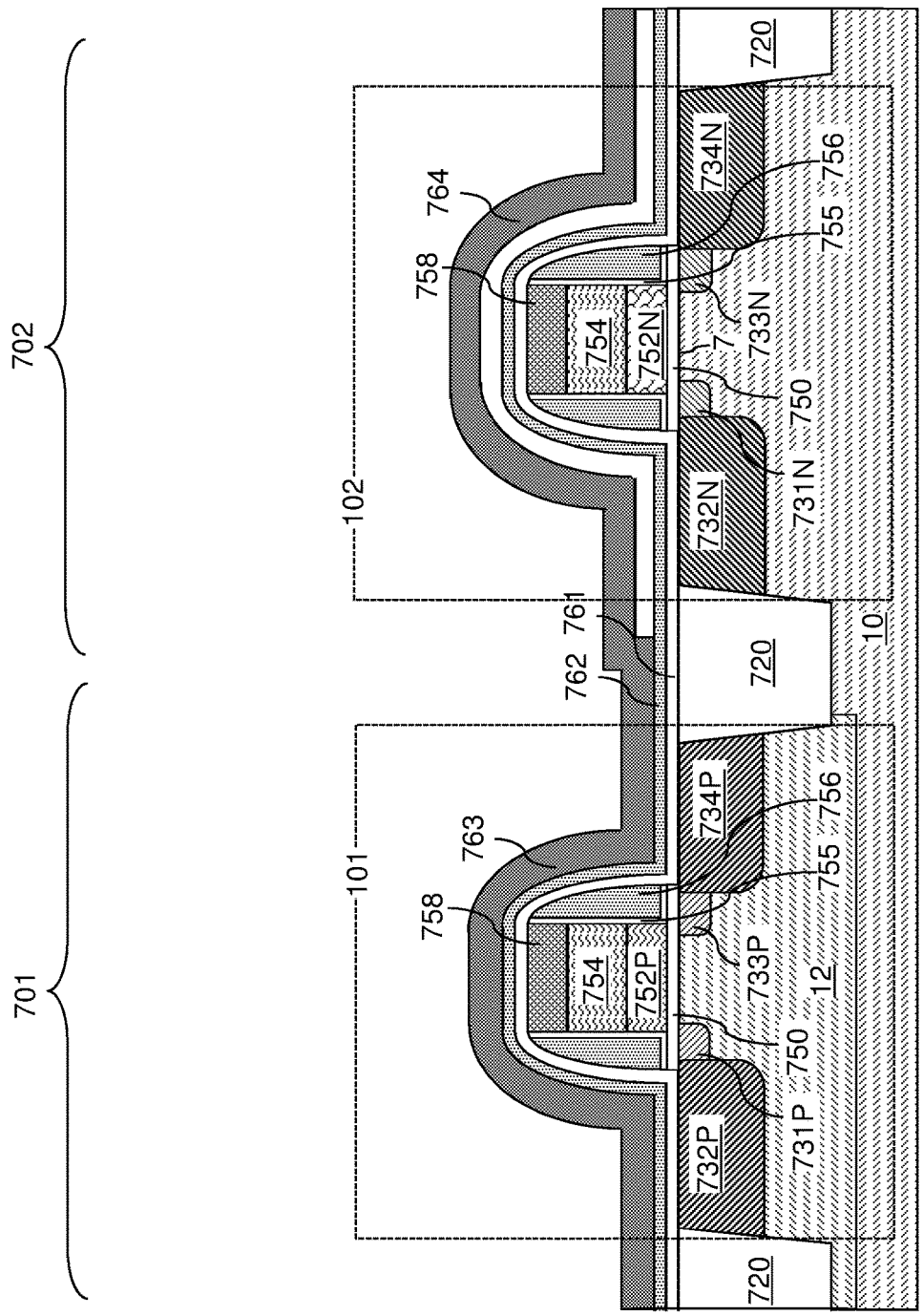
FIG. 6 is a schematic vertical cross-sectional view of the exemplary structure after formation of a second silicon nitride liner according to an embodiment of the present disclosure.

Referring to FIG. 6, a second silicon nitride liner 764 can be formed over the first silicon nitride liner 762 and the first silicon oxide liner 763 by a conformal or non-conformal deposition process. For example, the second silicon nitride liner 764 can be deposited by low pressure chemical vapor deposition or plasma enhanced chemical vapor deposition. The thickness of horizontal portions of the second silicon nitride liner 764 can be in a range from 10 nm to 120 nm, such as from 20 nm to 80 nm, although lesser and greater thicknesses can also be employed. In one embodiment, the thickness of horizontal portions of the second silicon nitride liner 764 can be at least twice, and/or at least three times, the greater of the thicknesses of the first silicon oxide liner 761 and the first silicon nitride liner 762. In one embodiment, the thickness of horizontal portions of the second silicon nitride liner 764 can be greater than the thickness of the horizontal portions of the second silicon oxide liner 763. The second silicon nitride liner 764 contacts the second silicon nitride liner 762 in the first device region 701 and contacts the second silicon oxide liner in the second device region 702.

Figure 7:
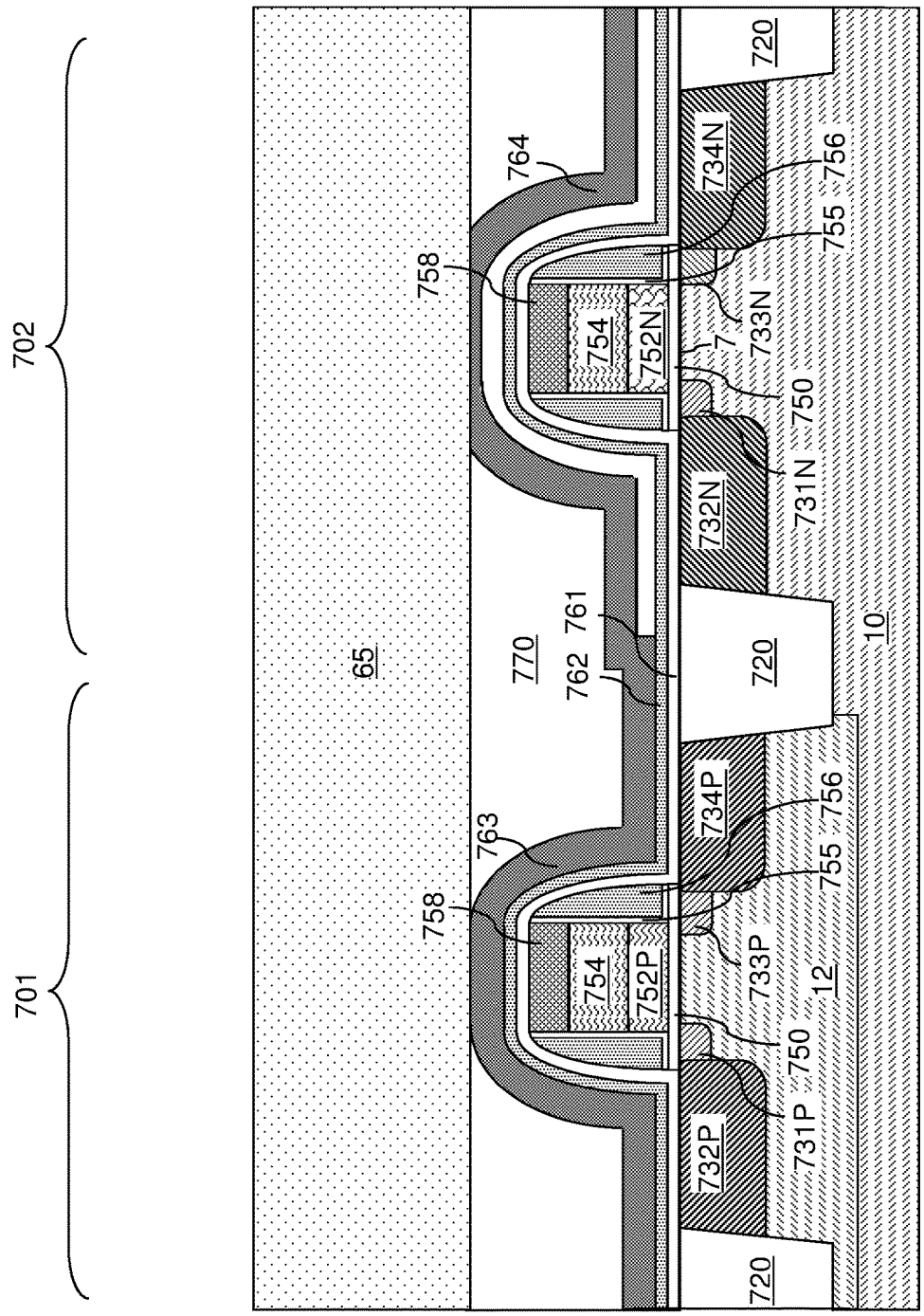
FIG. 7 is a schematic vertical cross-sectional view of the exemplary structure after deposition and planarization of a planarization silicon oxide layer and a contact level dielectric layer according to an embodiment of the present disclosure.

Referring to FIG. 7, a silicon oxide layer is subsequently deposited over the second silicon nitride liner 764. The silicon oxide layer is herein referred to as a planarization silicon oxide layer 770. The planarization silicon oxide layer 770 can include a first silicate glass material. In one embodiment, the planarization silicon oxide layer 770 can include undoped silicate glass that is not doped with dopants such as boron, phosphorous, or arsenic. The duration of the deposition process can be selected such that the bottommost portion of the top surface of the planarization silicon oxide layer 770 is formed above a horizontal plane including a topmost surface of the second silicon nitride liner 764.

Subsequently, the planarization silicon oxide layer 770 and the second silicon nitride liner 764 can be planarized to provide a planarized top surface for the planarization silicon oxide layer 770 and a planarized top surface for the silicon nitride liner 764. The planarization process can employ a chemical mechanical planarization (CMP) process that includes an initial planarization step and a terminal planarization step. In the initial planarization step, the silicon oxide material of the planarization silicon oxide layer 770 can be removed until a top surface of the second silicon nitride liner 764 is physically exposed in the second device region 702 (e.g., second silicon nitride liner 764 can be used as a polish stop). The total thickness of the first silicon oxide liner 761, the first silicon nitride liner 762, and the second silicon nitride liner 764 that overlie the gate electrode (752P, 754) of the p-type field effect transistor 101 in the first device region 701 is less than the total thickness of the first silicon oxide liner 761, the first silicon nitride liner 762, the second silicon oxide layer 763, and the second silicon nitride liner 764 that overlie the gate electrode (752N, 754) of the n-type field effect transistor 102 in the second device region 702 prior to the planarization process. In one embodiment, a portion of the top surface of the second silicon nitride liner 764 is physically exposed in the second device region 702 while the second silicon nitride liner 764 is not physically exposed in the first device region 701. In another embodiment, the top surface of the second silicon nitride liner 764 is physically exposed in the first and the second device regions (701, 702).

Optionally, a terminal planarization step of the planarization process can be subsequently performed, in which the materials of the second silicon nitride liner 764, the second silicon oxide liner 763, and the planarization silicon oxide liner 770 are non selectively removed at the same time. The terminal planarization step can proceed until the top surface of the second silicon nitride liner 764 is physically exposed in the first device region 701. The portion of the second silicon nitride liner 764 in the second device region 702 is removed down to the horizontal plane including the physically exposed portion of the top surface of the second silicon nitride liner 764 in the first device region 701.

In one embodiment, the thickness of the horizontal portions of the second silicon nitride liner 764 as deposited may be greater than the thickness of the horizontal portions of the second silicon oxide liner 763, and a portion of the second silicon nitride liner 764 overlies the gate electrode (752N, 754) of the n-type field effect transistor 102 in the second device region 702. In another embodiment, the thickness of the horizontal portions of the second silicon nitride liner 764 as deposited may be the same as, or less than, the thickness of the horizontal portions of the second silicon oxide liner 763, and the second silicon nitride liner 764 may not be present over the gate electrode (752N, 754) of the n-type field effect transistor 102 in the second device region 702. Thus, the total thickness of remaining portions of the first silicon oxide liner 761, the first silicon nitride liner 762, and the second silicon nitride liner 764 that overlie the gate electrode of the p-type field effect transistor 101 in the first device region 701 can be the same as the total thickness of remaining portions of the first silicon oxide liner 761, the first silicon nitride liner 762, the second silicon oxide liner 763, and the second silicon nitride liner 764 (if present) that overlie the gate electrode of the n-type field effect transistor 102 in the second device region 702 after the terminal planarization step of the planarization process.

Optionally, additional semiconductor devices (not shown) can be formed in other regions of the semiconductor substrate (10, 12). For example, a three-dimensional memory device may be formed in a memory array region located outside the first device region 701 and the second device region 702.

A contact level dielectric layer 65 can be deposited over the planarization silicon oxide layer 770 after planarizing the planarization silicon oxide layer 770 and the second silicon nitride liner 764 and during, or after, formation of the additional semiconductor devices. The contact level dielectric layer 65 can include a second silicate glass material, which may, or may not, be the same as the first silicate glass material. For example, contact level dielectric layer 65 can include undoped silicate glass (e.g., silicon oxide) formed by decomposition of TEOS in a low pressure chemical vapor deposition (LPCVD) process. This layer can be annealed to increase its density (i.e., to form a so-called densified TEOS oxide). Alternatively, the contact level dielectric layer 65 can include doped silicate glass (such as borophosphosilicate glass, borosilicate glass, phosphosilicate glass, or arsenosilicate glass), or porous or non-porous organosilicate glass. The thickness of the contact level dielectric layer 65 can be in a range from 100 nm to 600 nm, although lesser and greater thicknesses can also be employed.

Figure 8:
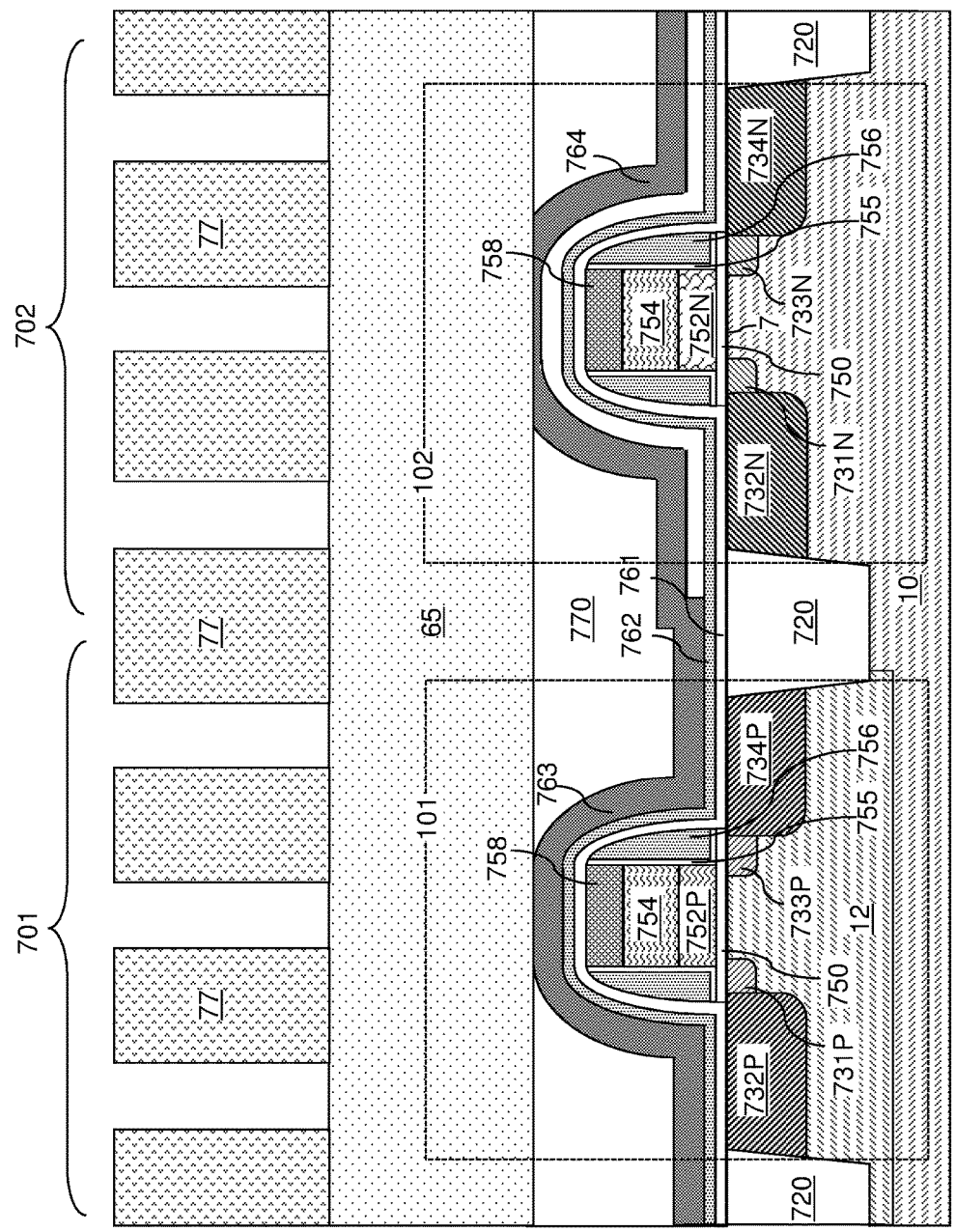
FIG. 8 is a schematic vertical cross-sectional view of the exemplary structure after application can patterning of a photoresist layer to form contact openings therein according to an embodiment of the present disclosure.

Referring to FIG. 8, a photoresist layer 77 can be applied over the contact level dielectric layer 65, and can be lithographically patterned to form contact openings in areas in which contact via structures (i.e., source and drain electrodes) are to be subsequently formed contacting the various elements of the p-type field effect transistor 101 and the n-type field effect transistor 102. For example, openings can be formed in areas of the p-doped active regions (732P, 734P), the n-doped active regions (732N, 734N), the gate electrode (752P, 754) of the p-type field effect transistor 101, and the gate electrode (752N, 754N) of the n-type field effect transistor 102.

Figure 9:
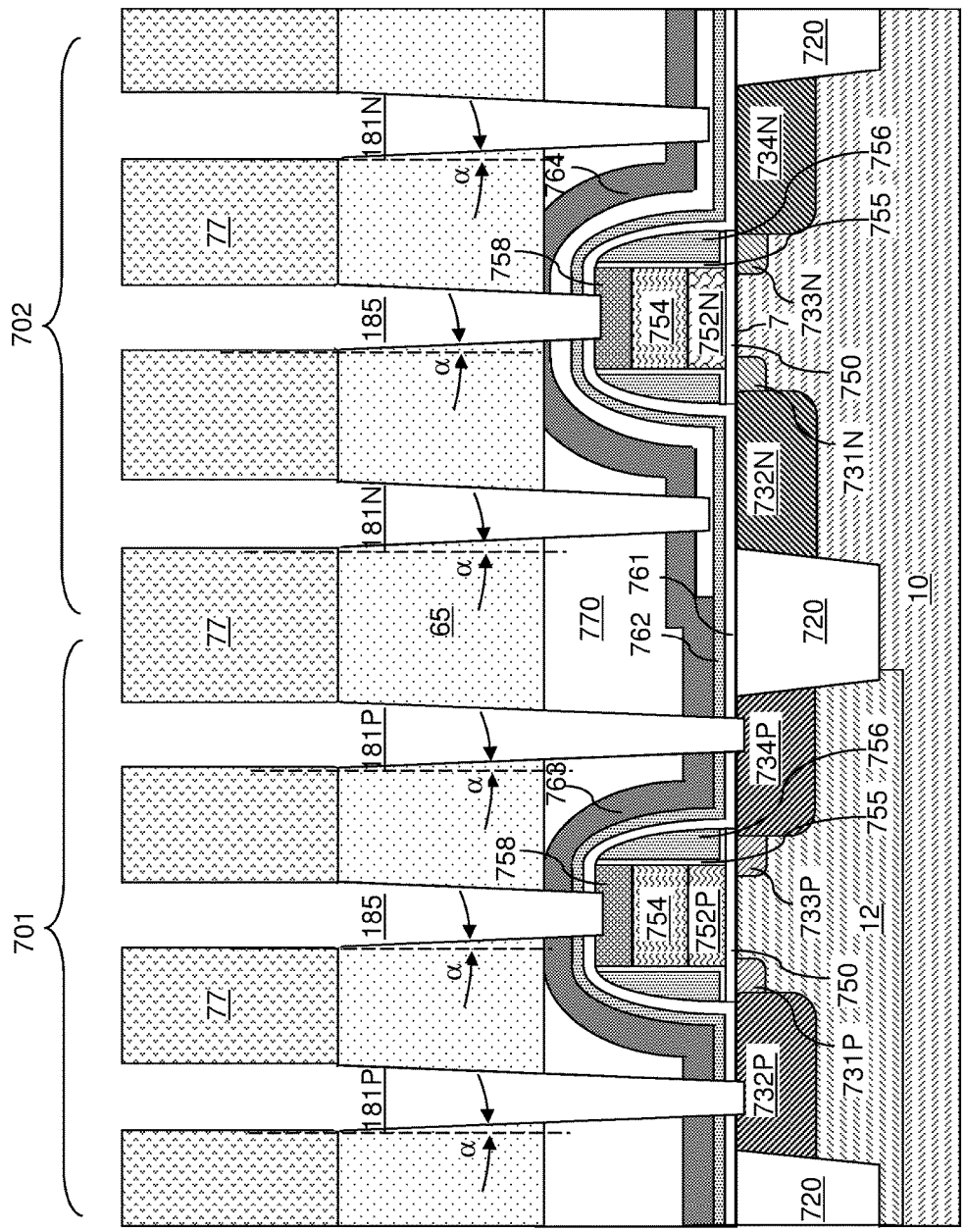
FIG. 9 is a schematic vertical cross-sectional view of the exemplary structure after formation of contact via cavities according to an embodiment of the present disclosure.

Referring to FIG. 9, various contact via cavities (181P, 181N, 185) can be formed by anisotropically etching portions of the contact level dielectric layer 65, the planarization silicon oxide layer 770, the second silicon nitride liner 764, the second silicon oxide liner 763, the first silicon nitride liner 762, and the first silicon oxide liner 761. The various contact via cavities (181P, 181N, 185) are simultaneously formed by a first anisotropic etch process that employs the photoresist layer 77 as an etch mask. The various contact via cavities (181P, 181N, 185) include p-type active region via cavities 181P that are formed over the p-doped active regions (732P, 734P), n-type active region via cavities 181N that are formed over the n-doped active regions (732N, 734N), and gate contact via cavities 185 that are formed over the gate electrodes {(752P, 754), (752N, 754)}.

In one embodiment, the first anisotropic etch process can include multiple etch steps having different etch chemistries, which can be selected to form the p-type active region via cavities 181P, the n-type active region via cavities 181N, and gate contact via cavities 185 with different depths. In one embodiment, the p-type active region via cavities 181P extend to a top surface of the respective p-doped active regions (732P, 734P), and the n-type active region via cavities 181N have a bottom surface within one of the second silicon oxide liner 763, the first silicon nitride liner 762, and the first silicon oxide liner 761 (i.e., such that the respective n-doped regions (732N, 734N) are not exposed in these cavities 181N due to the presence of the relatively thick second silicon oxide liner 763 in the second device region 702 but not in the first device region 701. The multiple etch steps can employ different etchant gases, which can be selected from fluorocarbon gases, hydrofluorocarbon gases, $SF_6$, $NF_3$, $O_2$, $O_3$, and combinations thereof. Argon may be added to the plasma during the anisotropic etch process. The etchant species can be selected to etch silicon oxide selective to silicon nitride, to etch silicon nitride selective to silicon oxide, or to non-selectively etch silicon oxide and silicon nitride (i.e., to etch silicon oxide and silicon nitride at about the same etch rate).

One of the gate contact via cavities 185 can be formed through the contact level dielectric layer 65 and through the portions of the first silicon oxide liner 761, the first silicon nitride liner 762, and the second silicon nitride liner 764 that overlie the gate electrode (752P, 754) of the p-type field effect transistor in the first device region 701 during the first anisotropic etch process. Another of the gate contact via cavities 185 can be formed through the contact level dielectric layer 65 and through the portions of the first silicon oxide liner 761, the first silicon nitride liner 762, the second silicon oxide liner 763, and the second silicon nitride liner 764 that overlie the gate electrode (752N, 754) of the n-type field effect transistor in the second device region 702 during the first anisotropic etch process. Bottom surfaces of the gate contact via cavities 185 can be formed on surfaces of gate cap nitride portions 758 that overlie the gate electrodes {(752P, 754), (752N, 754)} of the p-type field effect transistor 101 and the n-type field effect transistor 102.

In one embodiment, the first anisotropic etch process can include a first etch step that etches silicon oxide of the contact level dielectric layer 65 and the planarization silicon oxide layer 770 selective to silicon nitride of the second silicon nitride liner 764, a second etch step that etches physically exposed portions of the second silicon nitride liner 764 and the first silicon nitride liner 762, and a third etch step that etches physically exposed portions of the first silicon oxide liner 761. The first etch step can employ an etch chemistry that etches silicon oxide selective to silicon nitride. In this case, bottom surfaces of the p-type active region via cavities 181P and the n-type active region via cavities 181N can be at the interface between the planarization silicon oxide layer 770 and the second silicon nitride liner 764 at the end of the first etch step.

In one embodiment, the second etch step and the third etch step can employ the same etch chemistry that etches silicon nitride and silicon oxide non-selectively, and the second silicon oxide liner 763 has a thickness that is in a range from 20% to 80% of the sum of thicknesses of the first silicon oxide liner 761, the first silicon nitride liner 762, and the second silicon nitride liner 764 over the p-doped active regions (732P, 734P). All thicknesses are measured in horizontal portions. In this case, the durations of the second etch step and the third etch step can be selected such that the p-type active region via cavities 181P extend through the entire stack of the second silicon nitride liner 764, the first silicon nitride liner 762, and the first silicon oxide liner 761 in the first device region 701, whereas the n-type active region via cavities 181N do not extend through the entire stack of the second silicon nitride liner 764, the second silicon oxide liner 763, the first silicon nitride liner 762, and the first silicon oxide liner 761 located in the second device region 702 and having a greater total thickness than the total thickness of the stack of the second silicon nitride liner 764, the first silicon nitride liner 762, and the first silicon oxide liner 761 in the first device region 701. The second silicon oxide liner 763 provides an extra thickness in the second device region 702 that is a range from 20% to 80% of the total thickness of the stack of the second silicon nitride liner 764, the first silicon nitride liner 762, and the first silicon oxide liner 761 in the first device region 701. Thus, the bottom surfaces of the n-type active region via cavities 181N can terminate in one of the layers selected from the second silicon oxide liner 763, the first silicon nitride liner 762, and the first silicon oxide liner 761.

Alternatively, the second etch step can employ an etch chemistry that etches silicon nitride selective to silicon oxide, and the third etch step can employ an etch chemistry that etches silicon oxide selective to silicon nitride. In this case, the bottom surfaces of the p-type active region via cavities 181P can be formed at, or below, an interface between the first silicon nitride liner 762 and the first silicon oxide liner 761, and the bottom surfaces of the n-type active region via cavities 181N can be formed at, or below, an interface between the second silicon nitride liner 764 and the second silicon oxide liner 763. The duration of the third etch step can be selected such that the first silicon oxide liner 761 is etched through during the third step underneath the p-type active region via cavities 181P. Depending on the duration of the third etch step, the bottom surfaces of the n-type active region via cavities 181N can terminate in one of the layers selected from the second silicon oxide liner 763, the first silicon nitride liner 762, and the first silicon oxide liner 761.

In one embodiment, the etch chemistry of the third etch step can be selective to the silicon nitride to prevent the gate cap dielectric portions 758 from being etched through by the first anisotropic etch process. Top surfaces of the p-doped active regions (732P, 734P) are physically exposed at the bottom portions of the p-type active region via cavities 181P after the first anisotropic etch process. Top surfaces of the n-doped active regions (732N, 734N) are covered by the first silicon oxide liner 761, and may be covered by the first silicon nitride liner 762 and optionally by the second silicon oxide liner 763. In one embodiment, the bottom surfaces of the gate contact via cavities 185 can terminate on a top surface (which may be a recessed surface) of a respective one of the gate cap dielectric portions 758.

In one embodiment, each sidewall of the p-type active region via cavities 181P, n-type active region via cavities 181N, and gate contact via cavities 185 can be a straight sidewall having a uniform taper angle α throughout. The uniform taper angle a may be in a range from 0.01 degree to 5 degrees, although lesser and greater angles can also be employed.

Figure 10:
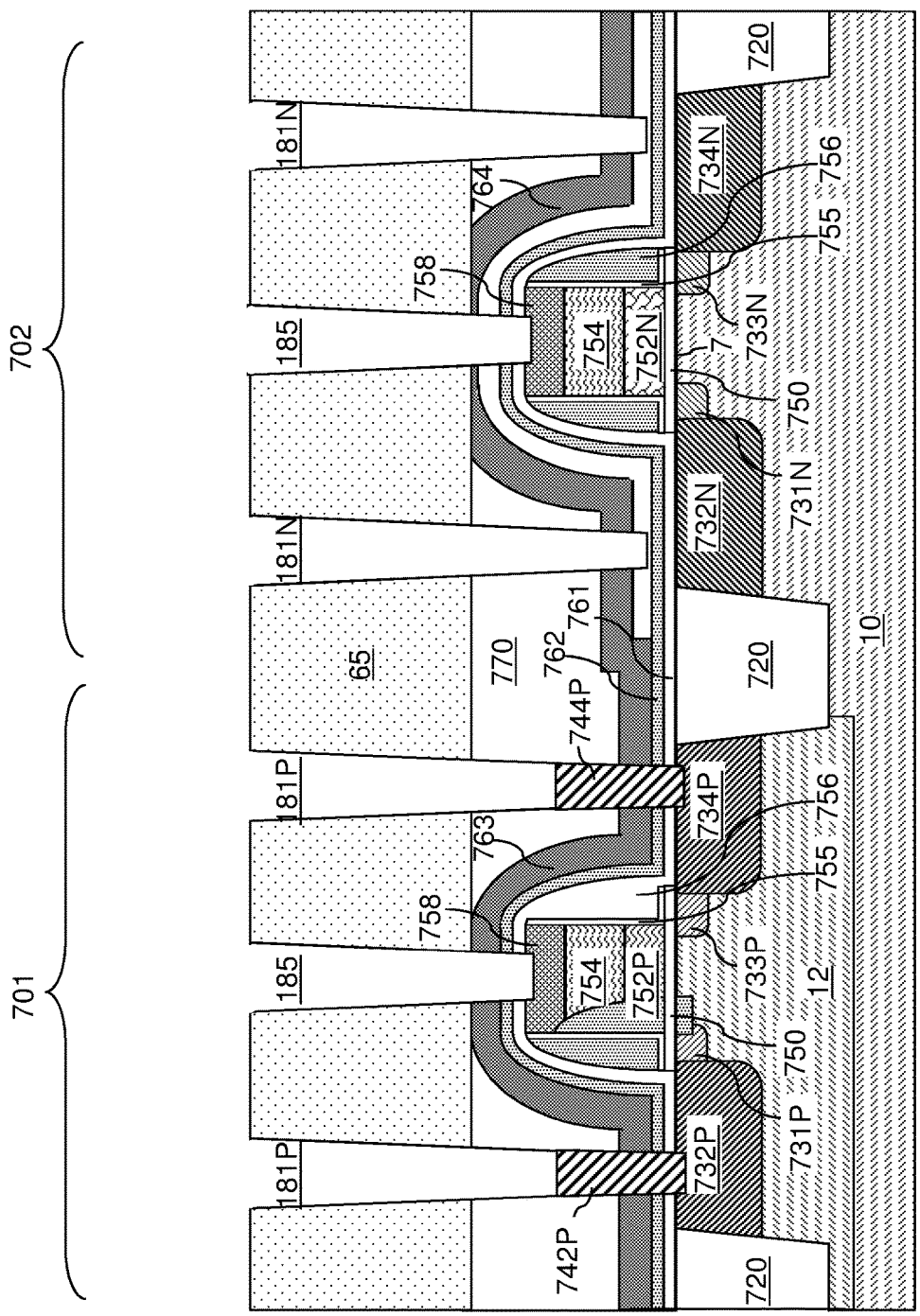
FIG. 10 is a schematic vertical cross-sectional view of the exemplary structure after formation of boron-doped epitaxial pillar structures according to an embodiment of the present disclosure.

Referring to FIG. 10, the photoresist layer 77 can be removed from above the contact level dielectric layer 65, for example, by ashing. A selective semiconductor (e.g., silicon) deposition process can be performed to grow a boron-doped semiconductor material only from physically exposed semiconductor surfaces. As used herein, a selective semiconductor deposition process refers to a deposition process that deposits a semiconductor material only on surfaces of a first type (e.g., from other semiconductor surfaces, such as silicon surfaces) without growth of the semiconductor material from surfaces of a second type (e.g., non-semiconductor surfaces)

Generally, selective growth of a semiconductor material can be performed by concurrently or alternatively flowing at least one reactant gas for depositing a semiconductor material and an etchant gas. The at least one reactant gas can be selected from semiconductor precursor gases such as $SiH_4$, $SiH_2Cl_2$, $SiHCl_3$, $SiCl_4$, $Si_2H_6$, $GeH_4$, and $Ge_2H_6$ to selectively grow silicon, germanium or silicon germanium. The etchant gas can be, for example, gaseous HCl. Different types of surfaces provide different incubation times for deposition of a semiconductor material. In other words, deposition of the semiconductor material can proceed only after a respective incubation time passes for each type of surface. The incubation time for semiconductor material deposition is negligible (less than microseconds) on semiconductor surfaces, while the incubation time for deposition of a semiconductor material on dielectric surfaces (such as silicon oxide surfaces and silicon nitride surfaces) can be in a range from 3 seconds to 30 seconds, and may be prolonged under some conditions. The flow rate of the etchant can be set such that the etchant can timely remove any residual semiconductor material that nucleates on dielectric surfaces to prevent growth of the semiconductor material from the dielectric surfaces, while the at least one reactant gas provides a greater deposition rate for the semiconductor material than the etch rate that the etchant provides for the semiconductor material. By concurrently or alternatively flowing the at least one reactant gas and the etchant gas, a selective semiconductor deposition process can induce deposition of a semiconductor material only from physically exposed semiconductor surfaces while suppressing growth of the semiconductor material from dielectric surfaces.

In one embodiment, the selective semiconductor deposition process can be a selective epitaxy process that deposits a boron-doped single crystalline silicon material on physically exposed single crystalline semiconductor surfaces, such as the physically exposed surfaces of the p-doped active regions (732P, 734P). In this case, boron-doped epitaxial pillar structures (742P, 744P) that are epitaxially aligned to an underlying p-doped active region (732P, 734P) can be grown from the physically exposed top surfaces of the p-doped active regions (732P, 734P). The boron-doped epitaxial pillar structures (742P, 744P) include a source-side boron-doped epitaxial pillar structure 742P that contacts the p-doped source region 732P and a drain-side boron-doped epitaxial pillar structure 744P that contacts the p-doped drain region 734P. The boron-doped epitaxial pillar structures (742P, 744P) are laterally confined in volume by the volume of a respective one of the p-type active region via cavities 181P. The top surfaces of the boron-doped epitaxial pillar structures (742P, 744P) can be formed above the horizontal plane including the horizontal portions of the top surface of the second silicon nitride liner 764 that directly overlie the p-doped active region (732P, 734P) and below the top surface of the contact level dielectric layer 65.

The height of the top surfaces of the boron-doped epitaxial pillar structures (742P, 744P) and the atomic concentration of boron atoms in the boron-doped epitaxial pillar structures (742P, 744P) can be optimized based on the degree of the loss of boron to the metallic contact via structures to be subsequently formed above the boron-doped epitaxial pillar structures (742P, 744P). In one embodiment, the atomic concentration of boron atoms in the boron-doped epitaxial pillar structures (742P, 744P) as formed can be greater than the atomic concentration of boron atoms in the p-doped active region (732P, 734P). For example, the concentration of boron atoms in the boron-doped epitaxial pillar structures (742P, 744P) as formed can be in a range from $2.0\times10^{20}/cm^3$ to $2.0\times10^{21}/cm^3$, although lesser and greater atomic boron concentrations can also be employed. The atomic concentration of boron atoms in the boron-doped epitaxial pillar structures (742P, 744P) in a final device, which is formed after at least one subsequent anneal processes that induces outdiffusion of boron atoms to overlying subsequently-formed metallic contact via structures, may be the same as, lesser than, or greater than, the atomic concentration of boron atoms in the p-doped active region (732P, 734P).

Figure 11:
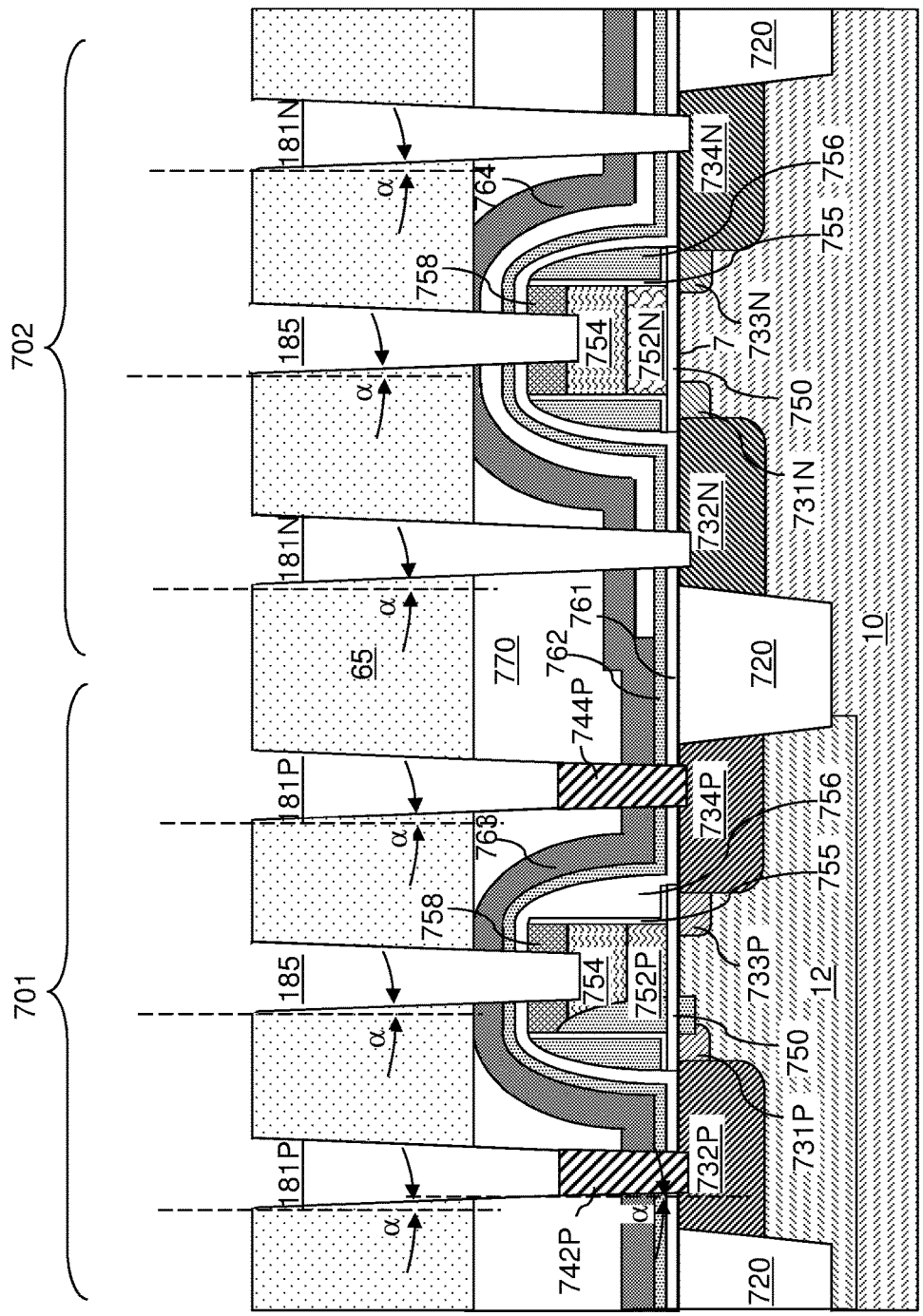
FIG. 11 is a schematic vertical cross-sectional view of the exemplary structure after vertical extension of n-type active region via cavities and gate contact via cavities according to an embodiment of the present disclosure.

Referring to FIG. 11, a second anisotropic etch process can be performed to etch silicon oxide materials and silicon nitride materials selective to the semiconductor material of the boron-doped epitaxial pillar structures (742P, 744P). The second etch process can be performed without employing any etch mask layer. The contact level dielectric layer 65 functions as an etch mask, which is collaterally vertically recessed during the second anisotropic etch process. In one embodiment, the second anisotropic etch process can employ an etch chemistry that etches silicon oxide and silicon nitride selective to the semiconductor material of the boron-doped epitaxial pillar structures (742P, 744P). For example, the second anisotropic etch process can employ a fluorocarbon etchant without employing oxygen to provide etch selectivity to the semiconductor material of the boron-doped epitaxial pillar structures (742P, 744P). The n-type active region via cavities are extended to the top surfaces of the n-doped active regions by a second anisotropic etch process that is performed without an etch mask layer. Each of the n-type active region via cavities 181N and the gate contact via cavities 185 can be vertically extended by the second anisotropic etch process. Specifically, the bottom surfaces of the n-type active region via cavities 181N can be vertically extended to the top surfaces of the n-doped active regions (732N, 734N). The gate cap dielectric portions 758 can be etched through during the second anisotropic etch process, the gate contact via cavities 185 extended through the gate cap dielectric portions 758. Thus, the bottom surfaces of the gate contact via cavities 185 can be vertically extended to a surface of a respective underlying gate electrode {(752P, 754), (752N, 754)}, such as a surface of a respective underlying metallic gate electrode portion 754.

In one embodiment, each sidewall of the p-type active region via cavities 181P, n-type active region via cavities 181N, and gate contact via cavities 185 can be a straight sidewall having a uniform taper angle α throughout. The uniform taper angle α may be in a range from 0.01 degree to 5 degrees, although lesser and greater angles can also be employed. The sidewalls of the boron-doped epitaxial pillar structures (742P, 744P) can have the same uniform taper angle α throughout.

Figure 12:
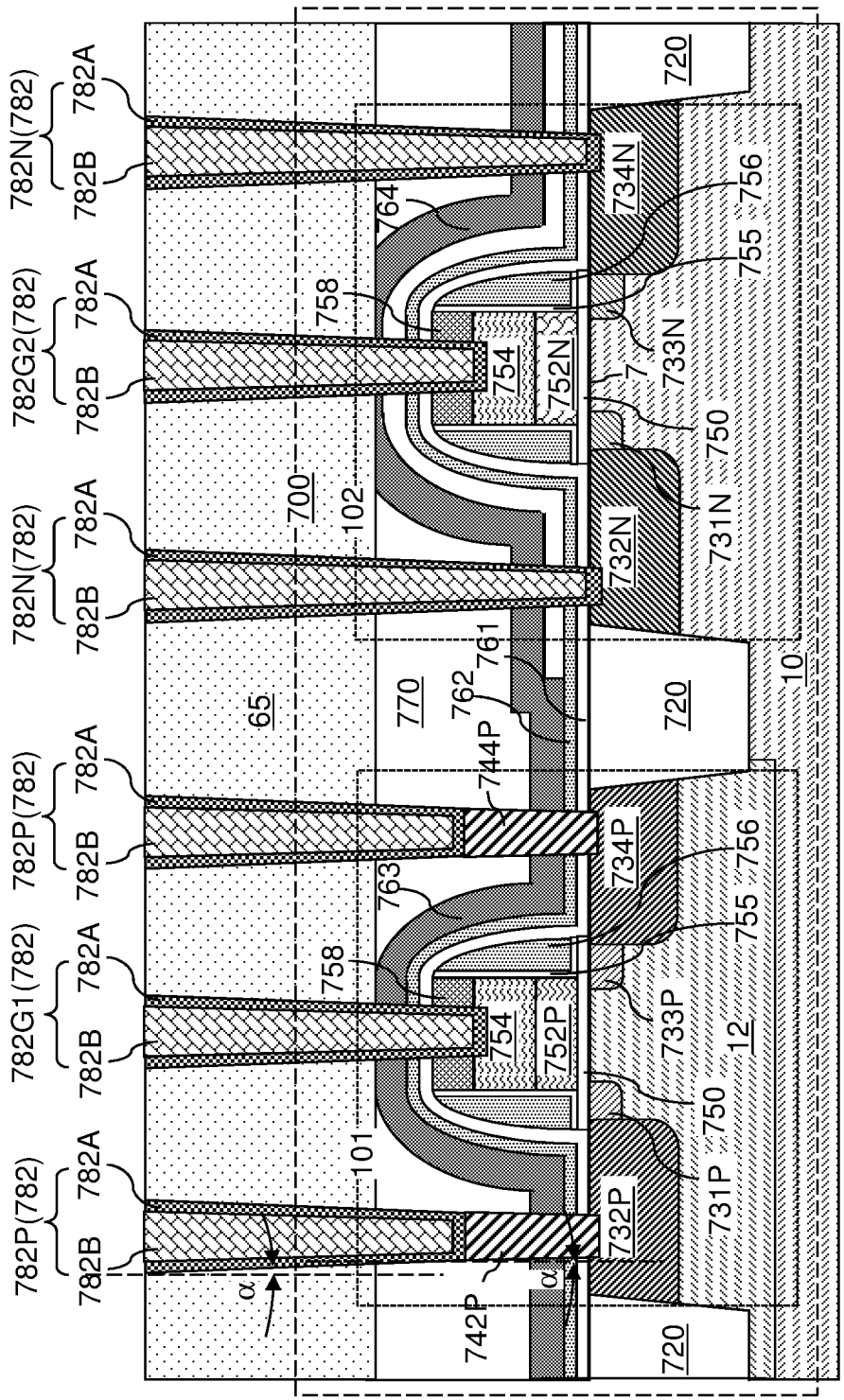
FIG. 12 is a schematic vertical cross-sectional view of the exemplary structure after formation of various contact via structures according to an embodiment of the present disclosure.

Referring to FIG. 12, various contact via structures (e.g., source and drain electrodes and gate contracts) 782 are formed in the p-type active region via cavities 181P, the n-type active region via cavities 181N, and the gate contact via cavities 185. For example, a metallic barrier material such as titanium, TiN, TaN, and/or WN can be deposited in the p-type active region via cavities 181P, the n-type active region via cavities 181N, and the gate contact via cavities 185. Subsequently, a metallic fill material such as W, Cu, Al, Ru, Co, and/or Mo can be deposited in remaining volumes of the p-type active region via cavities 181P, the n-type active region via cavities 181N, and the gate contact via cavities 185. Excess portions of the metallic fill material and the metallic barrier material can be removed from above the horizontal plane including the top surface of the contact level dielectric layer 65 by a planarization process such as chemical mechanical planarization. Each remaining portion of the metallic barrier material constitutes a metallic barrier liner 782A. Each remaining portion of the metallic fill material constitutes a metallic fill material portion 782B. Each adjoining pair of a metallic barrier liner 782A and a metallic fill material portion 782B constitutes a contact via structure 782.

The contact via structures 782 include first active region contact via structures (e.g., source and drain electrodes) 782P that are formed directly on a respective one of the boron-doped epitaxial pillar structures (742P, 744P) in the p-type active region via cavities 181P, second active region contact via structures (e.g., source and drain electrodes) 782N that are formed directly on a respective one of the n-doped active regions (732N, 734N), and gate contact via structures (e.g., gate contacts) (782G1, 782G2) that are formed directly one a respective one of the gate electrodes{ (752P, 754), (752N, 754)}. The p-type field effect transistor 101 and the n-type field effect transistor 102 can be components of a CMOS device 700, which can be employed to support operation of a memory device such as a three-dimensional memory device.

Figure 13:
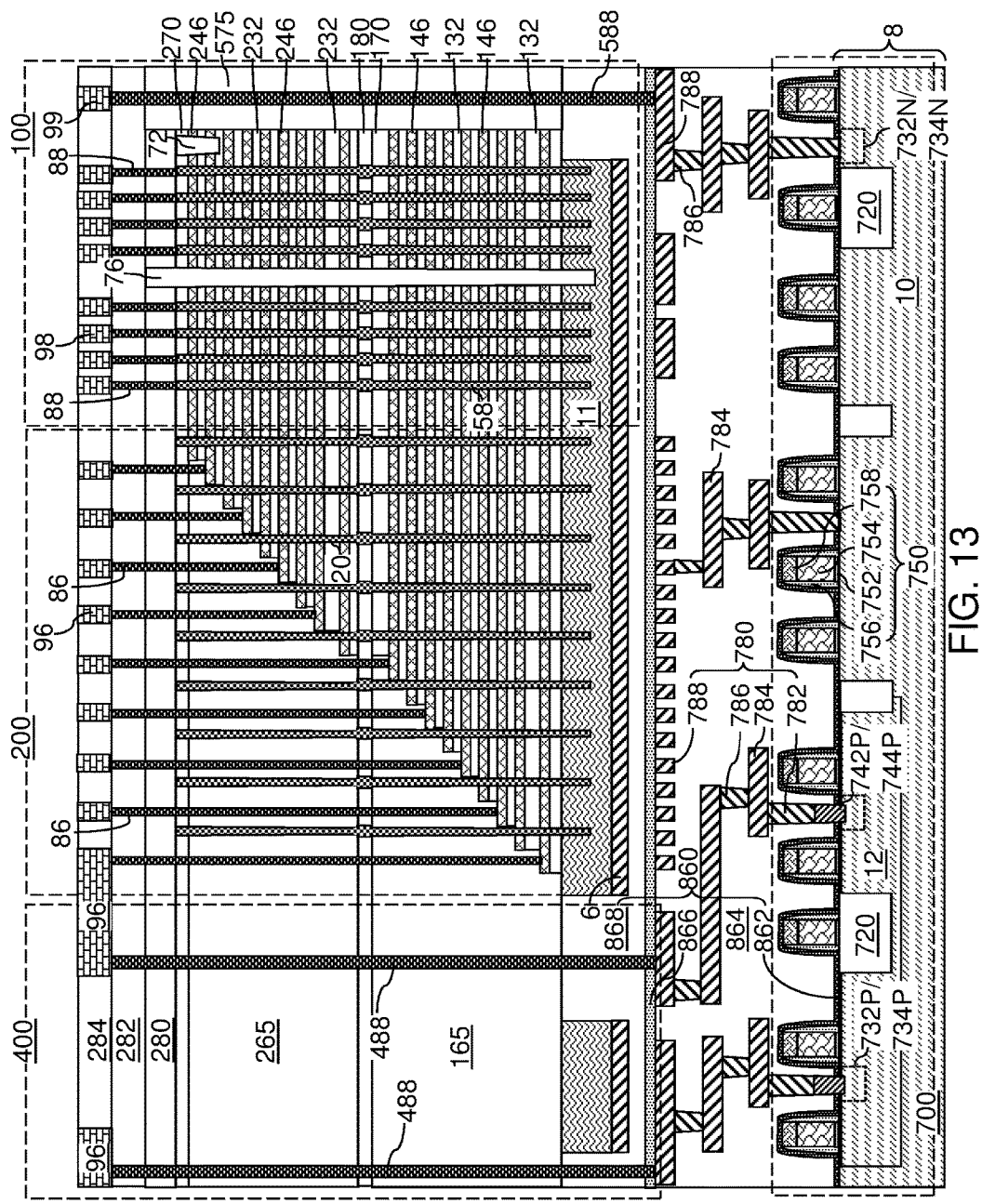
FIG. 13 is a schematic vertical cross-sectional view the exemplary structure after formation of a three-dimensional memory array over the field effect transistors according to an embodiment of the present disclosure.

Referring to FIG. 13, the exemplary structure is illustrated after formation of a three-dimensional memory array over the field effect transistors. The various field effect transistors on the semiconductor substrate 8 can include multiple instances of the p-type field effect transistors 101 and multiple instances of the n-type field effect transistors 102 described above. The semiconductor gate electrode portions 752 may be p-doped or n-doped as needed. The various silicon oxide liners (761, 763) and silicon nitride liners (762, 764) are herein collectively referred to dielectric liners 862.

Additional dielectric material layers can be formed over the exemplary structure. The dielectric liners 862, the planarization silicon oxide layer 770, the contact level dielectric layer 65, and the additional dielectric layers are herein collectively referred to as lower-level dielectric material layers 860. The lower-level dielectric material layers 860 can include, for example, the dielectric liners 862, first dielectric material layer 864 that include the planarization silicon oxide layer 770, the contact level dielectric layer 65, and a first subset of the additional dielectric layers, a dielectric diffusion barrier layer 866 (such as a silicon nitride layer) that overlies the first dielectric material layers 864, and at least one second dielectric layer 868 that overlies the dielectric diffusion barrier layer 866.

Lower-level metal interconnect structures 780 can be formed within lower-level dielectric material layers 860 level by level. The lower-level metal interconnect structures 780 can include the various contact via structures 782, various intermediate-level metal line structures 784, various metal via structures 786, and various top-level metal line structures 788. The dielectric diffusion barrier layer 866 and the at least one second dielectric layer 868 can be formed over the lower-level metal interconnect structures 780.

An optional layer of a metallic material and a layer of a semiconductor material can be deposited over, or within patterned recesses of, the at least one second dielectric material layer 868, and is lithographically patterned to provide an optional conductive plate layer 6 and source-level material layers 11. At least one alternating stack of insulating layers (132, 232) and spacer material layers can be formed and patterned to form stepped surfaces in a staircase region 200. A memory array region 100, in which each of the at least one alternating stack includes each layer therein, is provided adjacent to the staircase region. The spacer material layers can be formed as electrically conductive layers (146, 246), or can be formed as sacrificial material layers and can be subsequently replaced with electrically conductive layers (146, 246). For example, the at least one alternating stack can include a first alternating stack of first insulating layers 132 and first electrically conductive layers 146 and a second alternating stack of second insulating layers 232 and second electrically conductive layers 246. Retro-stepped dielectric material portions (165, 265) can be formed over the stepped surfaces. For example, a first retro-stepped dielectric material portion 165 can be formed over the first stepped surfaces of the first alternating stack (132, 146), and a second retro-stepped dielectric material portion 265 can be formed over the second stepped surfaces of the second alternating stack (232, 246). Intermediate dielectric material layers can be formed as needed. For example, the intermediate dielectric material layers can include a first insulating cap layer 170, an inter-tier dielectric layer 180, and a second insulating cap layer 270. Drain-select-level isolation structures 72 can be formed as needed.

Memory openings are formed through each layer in the at least one alternating stack (132, 146, 232, 246) in the memory array region 100, and are filled within memory opening fill structures 58. Each memory opening fill structure 58 includes a memory stack structure. Each memory stack structure can include a memory film and a vertical semiconductor channel laterally surrounded by the memory film. For example, each memory film can include a blocking dielectric, a charge storage layer, and a tunneling dielectric. Support openings in the staircase region 200 are filled with support pillar structures 20 which have the same composition and structure as the memory opening fill structures 58. Backside trenches can be formed through the at least one alternating stack (132, 146, 232, 246) to divide the at least one alternating stack (132, 146, 232, 246) into multiple memory blocks that are laterally spaced apart and electrically isolated among one another. A dielectric wall structure 76 can be formed within each backside trench. Dielectric pillar structures 575 can be optionally formed in the memory array region 100.

Various contact-level dielectric layers (280, 282) can be formed over the at least one alternating stack (132, 146, 232, 246). The various contact-level dielectric layers (280, 282) can include a first contact-level dielectric layer 280 and a second contact-level dielectric layer 282. Various upper-level contact via structures can be formed through the contact-level dielectric layers (280, 282) and underlying dielectric material portions. The upper-level contact via structures can include staircase region contact via structures 86 that contact a respective one of the first and second electrically conductive layers (146, 246), drain contact via structures 88 that contact a respective drain region (not expressly shown) at an upper end of an underlying memory stack structure, through-memory-level peripheral contact via structures 488 that contact a respective one of the lower-level metal interconnect structures 780 in a peripheral contact region 400, and through-memory-level array-region contact via structures 588 that extend through a respective dielectric pillar structures 575 and contact a respective one of the lower-level metal interconnect structures 780 in the memory array region 100.

A line-level dielectric layer 284 can be formed over the contact-level dielectric layers (280, 282). Upper metal line structures (96, 98, 99) can be formed in the line-level dielectric layer 284. The upper metal liner structures (96, 98, 99) can include peripheral interconnection line structures 96 that contact at least one of the staircase region contact via structures 86 and the through-memory-level peripheral contact via structures 488, bit lines 98 that contact a respective subset of the drain contact via structures 88, and array-region interconnection line structures 99 that contact a respective one of the through-memory-level array-region contact via structures 588.

Referring to all drawings and according to various embodiments of the present disclosure, a CMOS device 700 includes a p-type field effect transistor 101 containing p-doped active regions (732P, 734P), an n-type field effect transistor 102 containing n-doped active regions (732N, 734N), a silicon oxide layer 763 overlying the n-type field effect transistor 102 and not overlying the p-type field effect transistor 101, boron-doped epitaxial pillar structures (742P, 744P) contacting a top surface of, and epitaxially aligned to, a respective one of the p-doped active regions (732P, 734P), first active region contact via structures 782P contacting a top surface of a respective one of the boron-doped epitaxial pillar structures (742P, 744P), and second active region contact via structures 782N contacting a top surface of a respective one of the n-doped active regions (732N, 734N).

In one embodiment, the CMOS device 700 further comprises a first silicon oxide liner 761 contacting top surfaces of the p-doped active regions and the n-doped active regions, a first silicon nitride liner 762 overlying the first silicon oxide liner and extending over the p-type field effect transistor and the n-type field effect transistor, a second silicon oxide liner 763 which comprises the silicon oxide layer overlying a portion of the first silicon nitride liner 762 over the n-type field effect transistor 102 and not overlying the p-type field effect transistor 101, a second silicon nitride liner 764 overlying the second silicon oxide liner 763 over the n-type field effect transistor 102 and contacting the first silicon nitride liner over the p-type field effect transistor 101, and a planarization silicon oxide layer 770 overlying the second silicon nitride liner 764.

In another embodiment, the boron-doped epitaxial pillar structures (742P, 744P) protrude through the first silicon oxide liner 761, the first silicon nitride liner 762, and the second silicon nitride liner 764. The first active region contact via structures 782P extend through the planarization silicon oxide layer 770 to contact the top surface of the respective one of the boron-doped epitaxial pillar structures (742P, 744P). The second active region contact via structures 782N extend through the planarization silicon oxide layer, the second silicon nitride liner, the second silicon oxide liner, the first silicon nitride liner, and the first silicon oxide liner to contact the top surface of the respective one of the n-doped active regions (732N, 734N).

In one embodiment, the second silicon oxide liner 763 applies tensile stress to the n-type field effect transistor 102 and the second silicon nitride liner applies 764 compressive stress to the p-type field effect transistor 101.

In one embodiment, each of the boron-doped epitaxial pillar structures (742P, 744P) has a respective sidewall having a first taper angle α with respective to a vertical direction that is perpendicular to a top surface of the semiconductor substrate 8, each of the first active region contact via structures has a respective sidewall having a second taper angle α with respect to the vertical direction, and the second taper angle α is the same as the first taper angle α.

In one embodiment, each of the first active region contact via structures 782P and the second active region contact via structures 782N comprises a respective metallic barrier liner 782A having a same first material composition and a same thickness; and a respective metal fill material portion 782B having a same second metal composition.

In one embodiment, a planar top surface of a first portion of the second silicon nitride liner 764 that overlies the p-type field effect transistor and a planar top surface of a second portion of the second silicon nitride liner 764 that overlies the n-type field effect transistor and the second silicon oxide liner 763 are within a same horizontal plane as the top surface of the planarization silicon oxide layer 770.

In one embodiment, the semiconductor structure further comprises a contact level dielectric layer 65 overlying the planarization silicon oxide layer 770. A portion of the second silicon nitride liner 764 located between a gate electrode (752N, 754) of the n-type field effect transistor 102 and the contact level dielectric layer 65 has a lesser thickness than a portion of the second silicon nitride liner 764 located between a gate electrode (752P, 754) of the p-type field effect transistor 101 and the contact level dielectric layer 65, and top surfaces of the first active region contact via structures 782P and the second active region contact via structures 782N are within a same horizontal plane as a top surface of the contact level dielectric layer 65.

In one embodiment, the p-doped active regions (732P, 734P) include boron atoms at a first average atomic concentration, and the boron-doped epitaxial pillar structures (742P, 744P) include boron atoms at a second average atomic concentration that is different from the first average atomic concentration.

In one embodiment, a horizontal portion of the second silicon oxide liner 763 is at least twice as thick as a horizontal portion of the first silicon oxide liner 761; and a horizontal portion of the second silicon nitride liner 764 overlying one of the n-doped active regions (732N, 734N) is at least twice as thick as a horizontal portion of the first silicon nitride liner 762.

In one embodiment, top surfaces of the p-doped active regions (732P, 734P) and top surfaces of the n-doped active regions (732N, 734N) are within a horizontal plane that includes bottom surfaces of gate dielectrics 750 of the p-type field effect transistor and the n-type field effect transistor, and interfaces between the boron-doped epitaxial pillar structures (742P, 744P) and the p-doped active regions are recessed below the horizontal plane.

In one embodiment, a three-dimensional NAND memory device includes the CMOS device 700 located over a substrate 8, an alternating stack of insulating layers (132, 232) and word lines (146, 246) located over the CMOS device 700, and memory opening fill structures 58 which contain memory stack structures extend through the alternating stack and comprise a respective memory film and a vertical semiconductor channel.

Boron depletion due to absorption of boron atoms in the metallic materials of the first active region contact via structures 782P (e.g., in the Ti or TiN barrier layer 782A) can lead to formation of a Schottky junction at the bottom of the contact via structures 782P and a resulting high contact resistance. By forming in the boron-doped epitaxial pillar structures (742P, 744P) under the first active region contact via structures 782P avoids or reduces formation of a Schottky junction at the bottom of the contact via structures 782P and the resulting high contact resistance. Further, the boron concentration in the boron-doped epitaxial pillar structures (742P, 744P) at the time of formation can be controlled independent of the boron concentration in the p-doped active regions (732P, 734P). Thus, by providing excess boron atoms in the boron-doped epitaxial pillar structures (742P, 744P) at the time of formation, the effect of subsequent boron loss during anneal processes can be minimized. The boron-doped epitaxial pillar structures (742P, 744P) provide asymmetric contact structures between the p-type field effect transistors 101 and the n-type field effect transistors 102, which can be employed to enhance performance of the CMOS devices 700.

Furthermore, a compressive stress is desirable for improved PMOS 101 performance, while a tensile stress is desirable for improved NMOS 102 performance. The second silicon nitride liner 764 provides the compressive stress to the PMOS 101. In contrast, the second silicon oxide liner 763 which is located only over the NMOS 102 but not over the PMOS 101 provides the desired tensile stress to the NMOS 102. The second silicon oxide liner thus mitigates or alleviates the effect of the compressive stress from the second silicon nitride liner 764 on the NMOS 102.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A CMOS device, comprising:
   a p-type field effect transistor containing p-doped active regions;
   an n-type field effect transistor containing n-doped active regions;
   a silicon oxide layer overlying the n-type field effect transistor and not overlying the p-type field effect transistor;
   boron-doped epitaxial pillar structures contacting a top surface of, and epitaxially aligned to, a respective one of the p-doped active regions;
   first active region contact via structures contacting a top surface of a respective one of the boron-doped epitaxial pillar structures; and
   second active region contact via structures contacting a top surface of a respective one of the n-doped active regions.

2. The CMOS device of claim 1, further comprising:
   a first silicon oxide liner contacting top surfaces of the p-doped active regions and the n-doped active regions;
   a first silicon nitride liner overlying the first silicon oxide liner and extending over the p-type field effect transistor and the n-type field effect transistor;
   a second silicon oxide liner which comprises the silicon oxide layer overlying a portion of the first silicon nitride liner over the n-type field effect transistor and not overlying the p-type field effect transistor;
   a second silicon nitride liner overlying the second silicon oxide liner over the n-type field effect transistor and contacting the first silicon nitride liner over the p-type field effect transistor; and
   a planarization silicon oxide layer overlying the second silicon nitride liner.

3. The CMOS device of claim 2, wherein:
   the boron-doped epitaxial pillar structures protrude through the first silicon oxide liner, the first silicon nitride liner, and the second silicon nitride liner;
   the first active region contact via structures extend through the planarization silicon oxide layer to contact the top surface of the respective one of the boron-doped epitaxial pillar structures; and
   the second active region contact via structures extend through the planarization silicon oxide layer, the second silicon nitride liner, the second silicon oxide liner, the first silicon nitride liner, and the first silicon oxide liner to contact the top surface of the respective one of the n-doped active regions.

4. The CMOS device of claim 2, wherein:
   the second silicon oxide liner applies tensile stress to the n-type field effect transistor;
   the second silicon nitride liner applies compressive stress to the p-type field effect transistor;
   each of the boron-doped epitaxial pillar structures has a respective sidewall having a first taper angle with respect to a vertical direction that is perpendicular to a top surface of the semiconductor substrate;
   each of the first active region contact via structures has a respective sidewall having a second taper angle with respect to the vertical direction; and
   the second taper angle is the same as the first taper angle.

5. The CMOS device of claim 2, wherein each of the first active region contact via structures and the second active region contact via structures comprises:
   a respective metallic barrier liner having a same first material composition and a same thickness; and
   a respective metal fill material portion having a same second metal composition.

6. The CMOS device of claim 2, wherein a planar top surface of a first portion of the second silicon nitride liner that overlies the p-type field effect transistor and a planar top surface of a second portion of the second silicon nitride liner that overlies the n-type field effect transistor and the second silicon oxide liner are within a same horizontal plane as the top surface of the planarization silicon oxide layer.

7. The CMOS device of claim 6, further comprising a contact level dielectric layer overlying the planarization silicon oxide layer,
   wherein:
   a portion of the second silicon nitride liner located between a gate electrode of the n-type field effect transistor and the contact level dielectric layer has a lesser thickness than a portion of the second silicon nitride liner located between a gate electrode of the p-type field effect transistor and the contact level dielectric layer; and
   top surfaces of the first active region contact via structures and the second active region contact via structures are within a same horizontal plane as a top surface of the contact level dielectric layer.

8. The CMOS device of claim 2, wherein:
   the p-doped active regions include boron atoms at a first average atomic concentration;
   the boron-doped epitaxial pillar structures include boron atoms at a second average atomic concentration that is different from the first average atomic concentration;
   a horizontal portion of the second silicon oxide liner is at least twice as thick as a horizontal portion of the first silicon oxide liner; and
   a horizontal portion of the second silicon nitride liner overlying one of the n-doped active regions is at least twice as thick as a horizontal portion of the first silicon nitride liner.

9. The CMOS device of claim 1, wherein:
   top surfaces of the p-doped active regions and top surfaces of the n-doped active regions are within a horizontal plane that includes bottom surfaces of gate dielectrics of the p-type field effect transistor and the n-type field effect transistor; and
   interfaces between the boron-doped epitaxial pillar structures and the p-doped active regions are recessed below the horizontal plane.

10. A three-dimensional NAND memory device, comprising:
    the CMOS device of claim 1 located over a substrate;
    an alternating stack of insulating layers and word lines located over the CMOS device; and
    memory stack structures extending through the alternating stack and comprising a respective memory film and a vertical semiconductor channel.

* * * * *